(12) United States Patent
Choi et al.

(10) Patent No.: US 11,393,825 B2
(45) Date of Patent: Jul. 19, 2022

(54) MEMORY INCLUDING BOUNDARY CELL WITH ACTIVE CELL PATTERN

(71) Applicant: Samsung Electronics Co., Ltd., Suwon-si (KR)

(72) Inventors: Jay-Bok Choi, Yongin-si (KR); Su Ji Ahn, Seongnam-si (KR); Yong Seok Ahn, Seoul (KR); Seung Hyung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/887,297

(22) Filed: May 29, 2020

(65) Prior Publication Data

US 2021/0118886 A1 Apr. 22, 2021

(30) Foreign Application Priority Data

Oct. 21, 2019 (KR) .................. 10-2019-0130587

(51) Int. Cl.
*H01L 27/108* (2006.01)
*G11C 5/06* (2006.01)
*H01L 29/06* (2006.01)

(52) U.S. Cl.
CPC ........ *H01L 27/10823* (2013.01); *G11C 5/063* (2013.01); *H01L 27/10814* (2013.01); *H01L 27/10855* (2013.01); *H01L 27/10876* (2013.01); *H01L 27/10894* (2013.01); *H01L 27/10897* (2013.01); *H01L 29/0649* (2013.01)

(58) Field of Classification Search
CPC .......... H01L 29/0642; H01L 27/10823; H01L 27/10897; H01L 21/76816; H01L 21/762
See application file for complete search history.

(56) References Cited

U.S. PATENT DOCUMENTS

| | | | |
|---|---|---|---|
| 8,187,935 B2 | 5/2012 | Lee et al. | |
| 8,420,453 B2 | 4/2013 | Yoon et al. | |
| 9,184,168 B2 | 11/2015 | Ryu et al. | |
| 9,659,940 B2 | 5/2017 | Park et al. | |
| 2007/0155124 A1 | 7/2007 | Ahn et al. | |
| 2018/0047732 A1* | 2/2018 | Kim | H01L 23/5329 |
| 2018/0226411 A1* | 8/2018 | Jung | H01L 27/1104 |
| 2018/0301456 A1* | 10/2018 | Cho | H01L 27/10876 |
| 2018/0350611 A1* | 12/2018 | Kim | H01L 21/76832 |

FOREIGN PATENT DOCUMENTS

| | | |
|---|---|---|
| KR | 10-0983509 B1 | 9/2010 |
| KR | 10-1172310 B1 | 8/2012 |

* cited by examiner

*Primary Examiner* — Didarul A Mazumder
*Assistant Examiner* — Wasiul Haider
(74) *Attorney, Agent, or Firm* — Muir Patent Law, PLLC

(57) ABSTRACT

A semiconductor device includes a substrate having a cell region, a boundary region, a peripheral region sequentially arranged in a first direction, an active pattern extending in the cell region in a second direction forming a first acute angle with respect to the first direction, and a boundary pattern in the cell region and directly adjacent to the boundary region. The boundary pattern includes a first side surface extending in the second direction and a first boundary surface extending in a third direction, which is perpendicular to the first direction, from the first side surface, and the first boundary surface defines a boundary between the cell region and the boundary region.

19 Claims, 38 Drawing Sheets

MEMORY INCLUDING BOUNDARY CELL WITH ACTIVE CELL PATTERN

This application claims priority under 35 U.S.C. § 119 to Korean Patent Application No. 10-2019-0130587, filed on Oct. 21, 2019, in the Korean Intellectual Property Office, the disclosure of which is incorporated by reference herein in its entirety.

BACKGROUND

1. Technical Field

The present disclosure relates to a semiconductor device and a method of fabricating the same, and more particularly, to a semiconductor device including a cell region, a peripheral region and a boundary region therebetween, and a method of fabricating the semiconductor device.

2. Description of the Related Art

As semiconductor devices become more highly integrated, individual circuit patterns are becoming more miniaturized in order to implement more semiconductor devices in the same area.

A semiconductor memory device such as a dynamic random access memory (DRAM) may include a cell region and a peripheral region around the cell region. In the peripheral region, various circuits needed to control semiconductor memory cells formed in the cell region may be disposed.

SUMMARY

Aspects of the present disclosure provide a semiconductor device having improved product reliability because a boundary between a cell region and a boundary region is clearly defined.

Aspects of the present disclosure also provide a method of fabricating a semiconductor device having improved product reliability because a boundary between a cell region and a boundary region is clearly defined.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present invention, there is provided a semiconductor device comprising a substrate which comprises a cell region, a boundary region, and a peripheral region sequentially arranged in a first direction, an active pattern which extends in the cell region in a second direction forming a first acute angle with respect to the first direction, and a boundary pattern which is formed in the cell region and is directly adjacent to the boundary region, wherein the boundary pattern comprises a first side surface extending in the second direction and a first boundary surface extending in a third direction, which is perpendicular to the first direction, from the first side surface, and the first boundary surface defines a boundary between the cell region and the boundary region.

According to another aspect of the present invention, there is provided a semiconductor device comprising a substrate which comprises a cell region, a peripheral region around the cell region, and a boundary region between the cell region and the peripheral region, a plurality of active patterns in the cell region, a first boundary pattern which is formed in the cell region and comprises a first boundary surface defining a first portion of a boundary between the cell region and the boundary region, and a gate electrode which extends in a first direction and crosses the plurality of active patterns and the first boundary pattern, wherein a first width of each of the active patterns is greater than a second width of the first boundary pattern in a cut plane intersecting the first boundary surface and extending in the first direction.

According to still another aspect of the present invention, there is provided a semiconductor device comprising a substrate which comprises a cell region, a peripheral region around the cell region, and a boundary region between the cell region and the peripheral region, a plurality of active patterns in the cell region, a first boundary pattern which is formed in the cell region and is directly adjacent to the boundary region, a gate electrode which extends in a first direction and crosses the plurality of active patterns and the first boundary pattern, a bit line which extends in a second direction intersecting the first direction and is connected to a first source/drain region of each of the plurality of active patterns, and a capacitor structure which is formed on the cell region and is connected to a second source/drain region of each of the plurality of active patterns, wherein the first boundary pattern comprises a first side surface which extends in a third direction forming an acute angle with the first direction and a first boundary surface which defines a first portion of a boundary between the cell region and the boundary region.

According to still another aspect of the present disclosure, there is provided a method of fabricating a semiconductor device, the method comprising providing a substrate which comprises a cell region, a boundary region, and a peripheral region sequentially arranged along a first direction, forming a first mask pattern, which extends in a second direction forming a first acute angle with the first direction, on the substrate of the cell region, at least a part of the first mask pattern extending to the boundary region, forming a first trench in the substrate by patterning the substrate using the first mask pattern as an etch mask, and forming a second trench in the substrate to define the boundary region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Semiconductor devices according to embodiments will now be described with reference to FIGS. 1 through 13.

Figure 1:
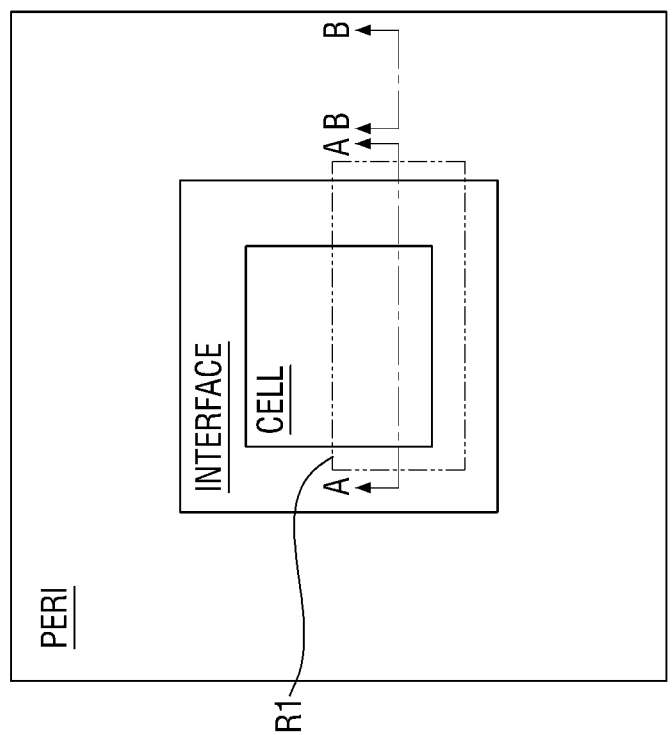
FIG. 1 is a layout view of a semiconductor device according to embodiments.
Figure 2:
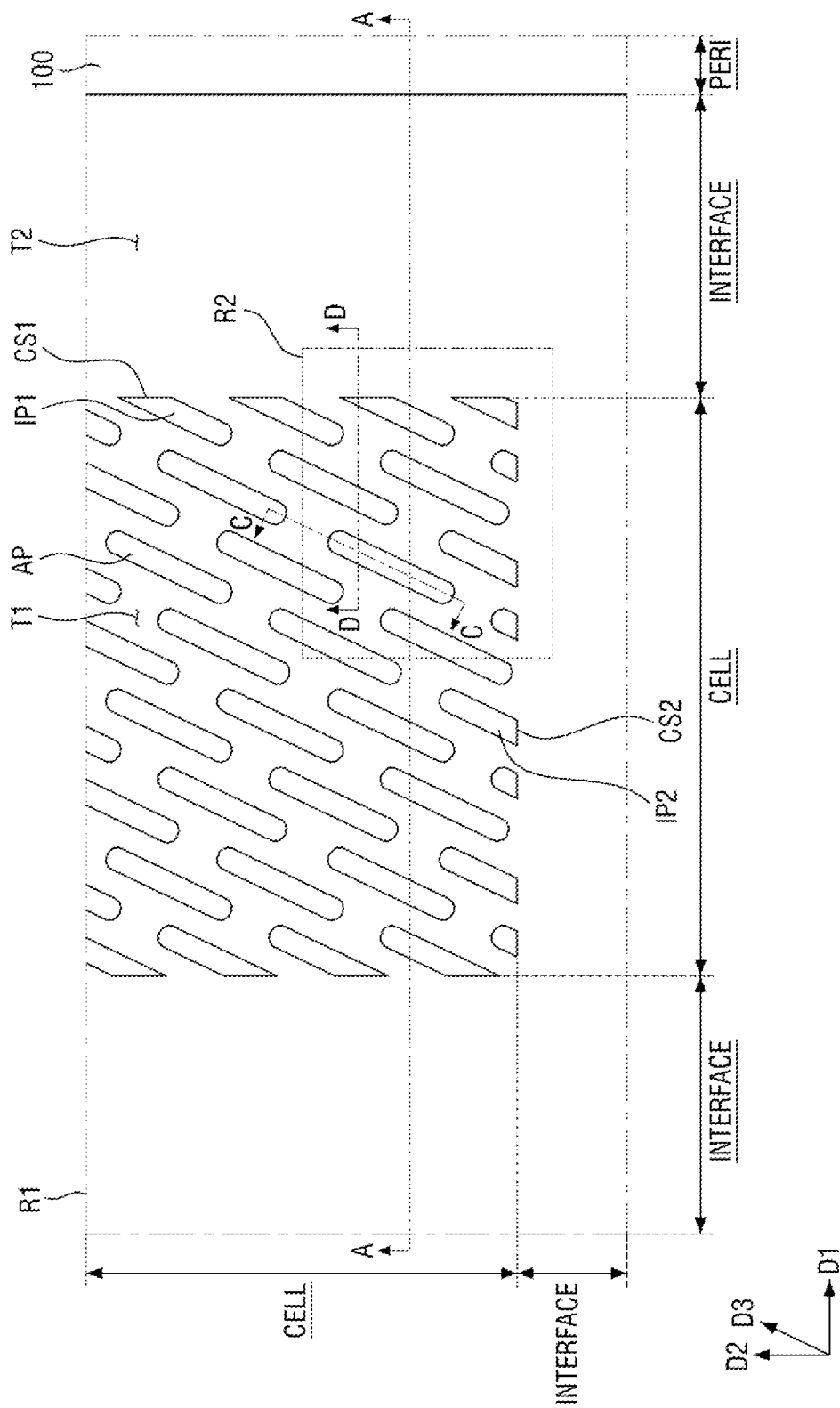
FIG. 2 is an enlarged view of region R1 of FIG. 1.
Figure 3:
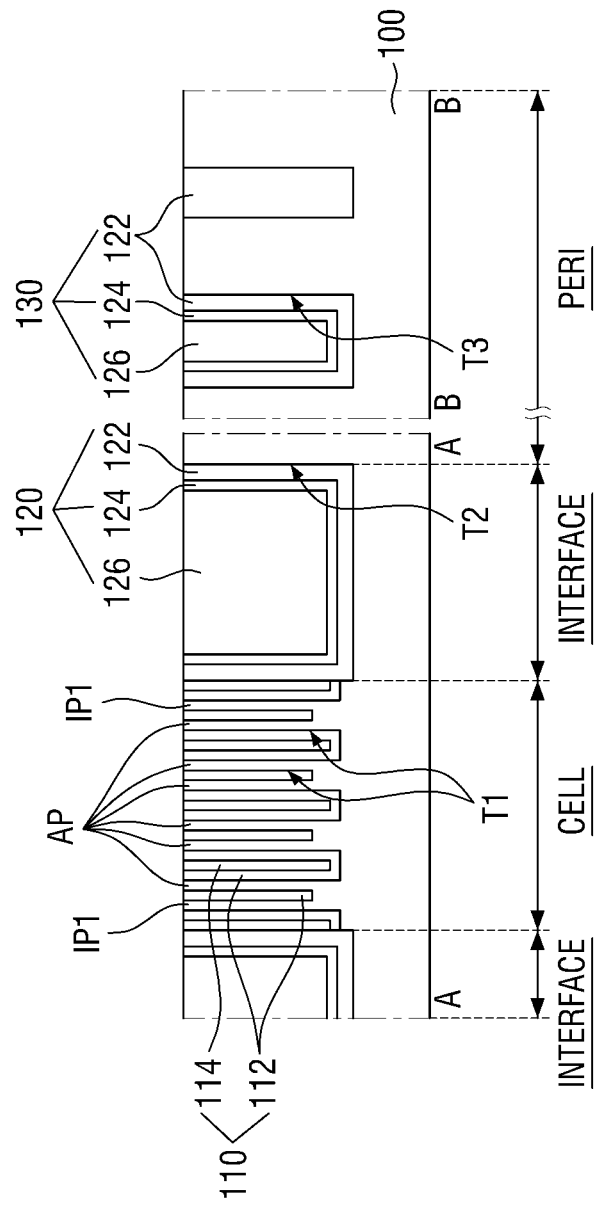
FIG. 3 is a cross-sectional view taken along lines A-A and B-B of FIG. 1.
Figure 4:
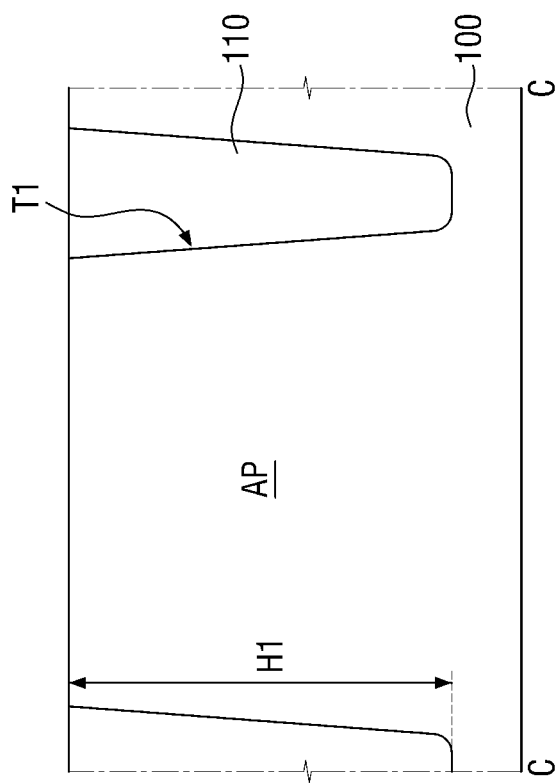
FIG. 4 is a cross-sectional view taken along line C-C of FIG. 2.
Figure 5:
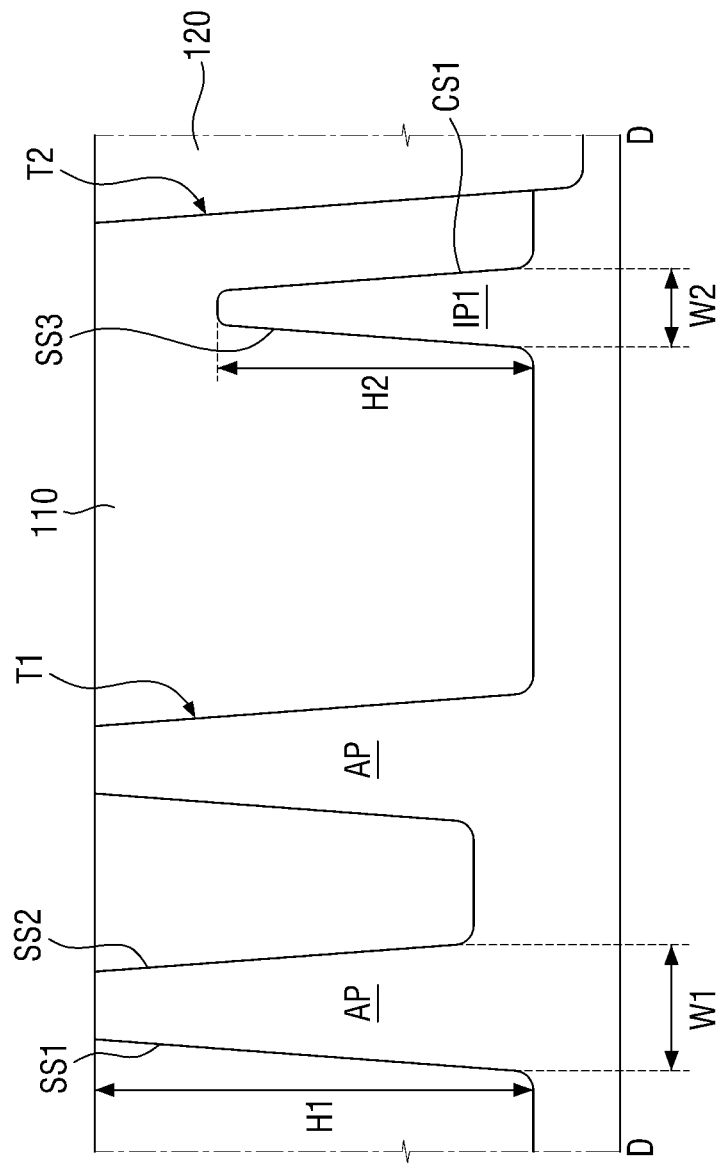
FIG. 5 is a cross-sectional view taken along line D-D of FIG. 2.
Figure 6:
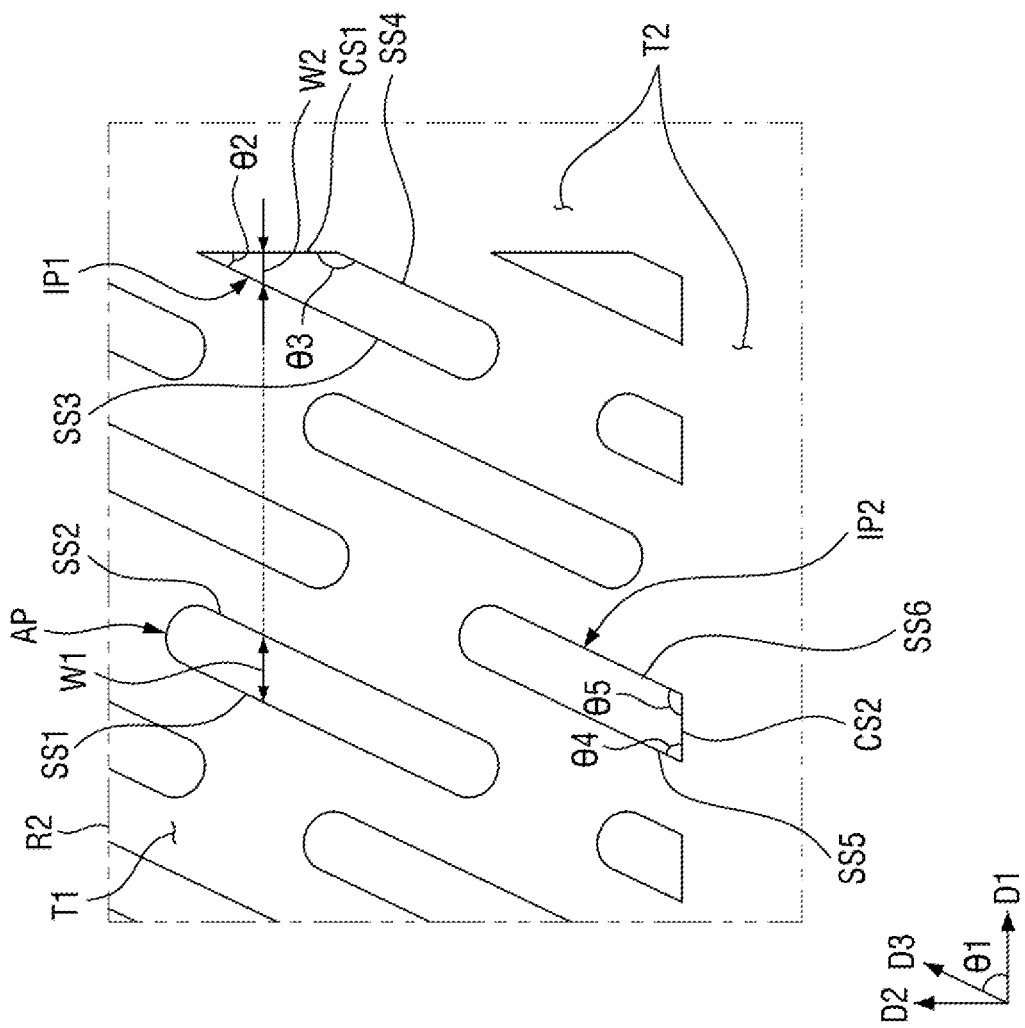
FIG. 6 is an enlarged view of region R2 of FIG. 2.

FIG. 1 is a layout view of a semiconductor device according to embodiments. FIG. 2 is an enlarged view of region R1 of FIG. 1. FIG. 3 is a cross-sectional view taken along lines A-A and B-B of FIG. 1. FIG. 4 is a cross-sectional view taken along line C-C of FIG. 2. FIG. 5 is a cross-sectional view taken along line D-D of FIG. 2. FIG. 6 is an enlarged view of region R2 of FIG. 2.

Referring to FIGS. 1 through 6, the semiconductor device according to the embodiments includes a plurality of active patterns AP, a plurality of first boundary patterns IP1, a plurality of second boundary patterns IP2, a first element isolation layer 110, a second element isolation layer 120, and a third element isolation layer 130.

A substrate 100 may have, but is not limited to, a structure in which a base substrate and an epitaxial layer are stacked. The substrate 100 may be a silicon substrate, a gallium arsenide substrate, a silicon germanium substrate, or a semiconductor-on-insulator (SOI) substrate. By way of example, the substrate 100 will be described below as a silicon substrate.

The substrate 100 may include a cell region CELL, a peripheral region PERI, and a boundary region INTERFACE.

The active patterns AP may be formed in the cell region CELL. In the cell region CELL, semiconductor cells including the active patterns AP may be arranged in an array. For example, when a semiconductor to be formed is a semiconductor memory device, an array of semiconductor memory cells may be formed in the cell region CELL.

The peripheral region PERI may be disposed around the cell region CELL or may be disposed in a separate region different from the cell region CELL. For example, the peripheral region PERI may surround the cell region CELL. In the peripheral region PERI, circuits needed to control semiconductor cells formed in the cell region CELL may be disposed. For example, control elements and dummy elements may be formed in the peripheral region PERI.

The boundary region INTERFACE may be interposed between the cell region CELL and the peripheral region PERI. For example, the boundary region INTERFACE may surround the cell region CELL, and the peripheral region PERI may surround the boundary region INTERFACE. An element isolation layer (e.g., the third element isolation layer 130 of FIGS. 3 and 5) may be formed in the boundary region INTERFACE. Accordingly, the boundary region INTERFACE may separate the cell region CELL and the peripheral region PERI.

In some embodiments, as illustrated in FIG. 2, the cell region CELL, a part of the boundary region INTERFACE, and a part of the peripheral region PERI may be sequentially arranged along a first direction D1 parallel to an upper surface of the substrate 100. In addition, the cell region CELL, another part of the boundary region INTERFACE, and another part of the peripheral region PERI may be sequentially arranged along a second direction D2 parallel to the upper surface of the substrate 100. Here, the second direction D2 may be a direction intersecting the first direction D1. For example, the second direction D2 may be orthogonal to the first direction D1.

The active patterns AP may be formed in the shape of a plurality of bars extending parallel to each other in a direction. In some embodiments, a center of one of the active patterns AP may be disposed adjacent to an end of another active pattern AP.

Each of the active patterns AP may be formed in the shape of a bar extending in a third direction D3 other than the first direction D1 and the second direction D2 in a plane in which the first direction D1 and the second direction D2 extend. Here, the third direction D3 may be parallel to the upper surface of the substrate 100 and may be any direction other than the first direction D1 and the second direction D2. In some embodiments, the third direction D3 may form a first acute angle θ1 with the first direction D1. The first acute angle θ1 may be, but is not limited to, 60 degrees. In an example embodiment, some of the active patterns AP arranged in the third direction D3 may be disposed between two boundary patterns (e.g., between two second dummy patterns IP2 or between the first dummy pattern IP1 and the second dummy pattern IP2). In an example embodiment, an area of each of the two boundary patterns may be smaller than an area of each of the active patterns AP.

For example, as illustrated in FIG. 6, each of the active patterns AP may include a first side surface SS1 and a second side surface SS2. The first side surface SS1 of each of the active patterns AP may extend in the third direction D3. The second side surface SS2 of each of the active patterns AP may be opposite the first side surface SS1 and may extend in the third direction D3.

In some embodiments, the active patterns AP may include impurities to form source and drain regions. For example, the active patterns AP may include p-type impurities or n-type impurities. Impurities may be injected into the active patterns AP by, e.g., an ion implantation process.

The first boundary patterns IP1 may be formed in the cell region CELL adjacent to the boundary region INTERFACE. For example, the first boundary patterns IP1 may be directly adjacent to the boundary region INTERFACE. The first boundary patterns IP1 may be interposed between the active patterns AP and the boundary region INTERFACE. For example, the active patterns AP, the first boundary patterns IP1, and the boundary region INTERFACE may be sequentially arranged along the first direction D1.

The first boundary patterns IP1 may be in the shape of a plurality of bars extending in the third direction in which the active patterns AP extends. In some embodiments, the center of one of the active patterns AP may be disposed adjacent to an end of a first boundary pattern IP1.

The first boundary patterns IP1 may be formed in the shape of bars extending in the third direction D3 in a plane in which the first direction D1 and the second direction D2 extend. For example, as illustrated in FIG. 6, each of the first boundary patterns IP1 may include a third side surface SS3 and a fourth side surface SS4. The third side surface SS3 of each of the first boundary patterns IP1 may extend in the third direction D3. The fourth side surface SS4 of each of the first boundary patterns IP1 may be opposite the third side surface SS3 and may extend in the third direction D3.

The first boundary patterns IP1 may define a boundary between the cell region CELL and the boundary region INTERFACE. For example, each of the first boundary patterns IP1 may further include a first boundary surface CS1 which defines the boundary between the cell region CELL and the boundary region INTERFACE. The first boundary surface CS1 of each of the first boundary patterns IP1 may extend in the second direction D2 to define the boundary between the cell region CELL and the boundary region INTERFACE.

In some embodiments, the first boundary surface CS1 of each of the first boundary patterns IP1 may extend in the second direction D2 to connect the third side surface SS3 and the fourth side surface SS4. Accordingly, the third side surface SS3 and the first boundary surface CS1 may form a first internal angle θ2, and the fourth side surface SS4 and the first boundary surface CS1 may form a second internal angle θ3.

In some embodiments, the sum of the first acute angle θ1 and the first internal angle θ2 may be 90 degrees. In some embodiments, the sum of the first internal angle θ2 and the second internal angle θ3 may be 180 degrees.

In some embodiments, the first boundary patterns IP1 may be arranged in the second direction D2. In this case, the first boundary surfaces CS1 of the first boundary patterns IP1 may lie in the same plane extending in the second direction D2.

In some embodiments, a width of each of the active patterns AP may be greater than a width of a first boundary pattern IP1 in a cut plane intersecting a first boundary surface CS1 and extending in the first direction D1. For example, as illustrated in FIG. 5, a first width W1 of each of the active patterns AP may be greater than a second width W2 of a first boundary pattern IP1.

In some embodiments, a height of each of the active patterns AP may be greater than a height of a first boundary pattern IP1 in a cut plane intersecting a first boundary surface CS1 and extending in the first direction D1. For example, as illustrated in FIG. 5, a first height H1 of each of the active patterns AP may be greater than a second height H2 of a first boundary pattern IP1.

The second boundary patterns IP2 may be formed in the cell region CELL adjacent to the boundary region INTERFACE. For example, the second boundary patterns IP2 may be directly adjacent to the boundary region INTERFACE. The second boundary patterns IP2 may be interposed between the active patterns AP and the boundary region INTERFACE. For example, the active patterns AP, the second boundary patterns IP2, and the boundary region INTERFACE may be sequentially arranged along the second direction D2.

The second boundary patterns IP2 may be in the shape of a plurality of bars extending in the third direction D3 in which the active patterns AP extend. In some embodiments, the center of one of the active patterns AP may be disposed adjacent to an end of a second boundary pattern IP2.

The second boundary patterns IP2 may be formed in the shape of bars extending in the third direction D3 in a plane in which the first direction D1 and the second direction D2 extend. For example, as illustrated in FIG. 6, each of the second boundary patterns IP2 may include a fifth side surface SS5 and a sixth side surface SS6. The fifth side surface SS5 of each of the second boundary patterns IP2 may extend in the third direction D3. The sixth side surface SS6 of each of the second boundary patterns IP2 may be opposite the fifth side surface SS5 and may extend in the third direction D3.

The second boundary patterns IP2 may define a boundary between the cell region CELL and the boundary region INTERFACE. For example, each of the second boundary patterns IP2 may further include a second boundary surface CS2 which defines the boundary between the cell region CELL and the boundary region INTERFACE. The second boundary surface CS2 of each of the second boundary patterns IP2 may extend in the first direction D1 to define the boundary between the cell region CELL and the boundary region INTERFACE.

In some embodiments, the second boundary surface CS2 of each of the second boundary patterns IP2 may extend in the first direction D1 to connect the fifth side surface SS5 and the sixth side surface SS6. Accordingly, the fifth side surface SS5 and the second boundary surface CS2 may form a third internal angle θ4, and the sixth side surface SS6 and the second boundary surface CS2 may form a fourth internal angle θ5.

In some embodiments, the third internal angle θ4 may be equal to the first acute angle θ1. In some embodiments, the sum of the third internal angle θ4 and the fourth internal angle θ5 may be 180 degrees.

In some embodiments, the second boundary patterns IP2 may be arranged along the first direction D1. In this case, the second boundary surfaces CS2 of the second boundary patterns IP2 may lie in the same plane extending in the first direction D1.

The first element isolation layer 110 may be formed in the cell region CELL. The first element isolation layer 110 may define the active patterns AP, the first boundary patterns IP1 and the second boundary patterns IP2 which protrude from the cell region CELL. For example, the substrate 100 in the cell region CELL may include a first trench T1 which defines the active patterns AP, the first boundary patterns IP1, and the second boundary patterns IP2. The first element isolation layer 110 may be formed to fill the first trench T1.

In FIGS. 4 and 5, the first trench T1 has sloping sidewalls. However, this is merely a characteristic of an etching process for forming the first trench T1, and the present disclosure is not limited to this case.

The first trench T1 may define the first and second side surfaces SS1 and SS2 of each of the active patterns AP, the third and fourth side surfaces SS3 and SS4 of each of the first boundary patterns IP1, and the fifth and sixth side surfaces SS5 and SS6 of each of the second boundary patterns IP2. Accordingly, the first element isolation layer 110 may contact and define the first and second side surfaces SS1 and SS2 of each of the active patterns AP, the third and fourth side surfaces SS3 and SS4 of each of the first boundary patterns IP1, and the fifth and sixth side surfaces SS5 and SS6 of each of the second boundary patterns IP2.

The first element isolation layer 110 may include, but is not limited to, at least one of silicon oxide, silicon nitride, silicon oxynitride, and combinations of the same.

In some embodiments, the first element isolation layer 110 may be formed as a multilayer. For example, as illustrated in FIG. 3, the first element isolation layer 110 may include a first insulating layer 112 and a second insulating layer 114 sequentially formed in the first trench T1. The first insulating layer 112 may extend along the profile of the first trench T1. The second insulating layer 114 may fill a part of the first trench T1 remaining after the first trench T1 is filled with the first insulating layer 112.

In some embodiments, the first insulating layer 112 and the second insulating layer 114 may include different materials. For example, the first insulating layer 112 may include silicon oxide, and the second insulating layer 114 may include silicon nitride.

The second element isolation layer 120 may be formed in the boundary region INTERFACE. The second element isolation layer 120 may define the boundary between the boundary region INTERFACE and the cell region CELL and a boundary between the boundary region INTERFACE and the peripheral region PERI. For example, the substrate 100 in the boundary region INTERFACE may include a second trench T2 which defines the boundary region INTERFACE. The second element isolation layer 120 may be formed to fill the second trench T2.

In FIG. 5, the second trench T2 has sloping sidewalls. However, this is merely a characteristic of an etching process for forming the second trench T2, and the present disclosure is not limited to this case.

The second trench T2 may define the first boundary surface CS1 of each of the first boundary patterns IP1 and the second boundary surface CS2 of each of the second boundary patterns IP2. Accordingly, the second element isolation layer 120 may contact and define the first boundary surface CS1 of each of the first boundary patterns IP1 and the second boundary surface CS2 of each of the second boundary patterns IP2. The term "contact," as used herein, refers to a direct connection (i.e., touching) unless the context indicates otherwise.

In some embodiments, a width of the second trench T2 may be greater than a width of the first trench T1. For example, as illustrated in FIG. 3, the width of the second trench T2 in the first direction D1 may be greater than the width of the first trench T1 in the first direction D1.

In some embodiments, the second trench T2 may be formed deeper than the first trench T1. For example, a bottom surface of the second trench T2 may be lower than a bottom surface of the first trench T1.

The second element isolation layer 120 may include, but is not limited to, at least one of silicon oxide, silicon nitride, silicon oxynitride, and combinations of the same.

The third element isolation layer 130 may be formed in the peripheral region PERI. The third element isolation layer 130 may define active regions of the substrate 100 which constitute control elements and dummy elements. For example, the substrate 100 in the peripheral region PERI may include a third trench T3. The third element isolation layer 130 may be formed to fill the third trench T3. As used herein, the term "dummy" is used to refer to a component that has the same or similar structure and shape as other components but does not have a substantial function and exists only as a pattern in the device.

The third element isolation layer 130 may include, but is not limited to, at least one of silicon oxide, silicon nitride, silicon oxynitride, and combinations of the same.

In some embodiments, the second element isolation layer 120 and the third element isolation layer 130 may be formed at the same level. As used herein, the term "same level" denotes that elements are formed by the same fabrication process. For example, the second element isolation layer 120 and the third element isolation layer 130 may be made of the same material.

In some embodiments, each of the second element isolation layer 120 and the third element isolation layer 130 may be formed as a multilayer. For example, as illustrated in FIG. 3, each of the second element isolation layer 120 and the third element isolation layer 130 may include a third insulating layer 122, a fourth insulating layer 124, and a fifth insulating layer 126 sequentially formed in the second trench T2 or the third trench T3. The third insulating layer 122 may extend along the profile of each of the second trench T2 and the third trench T3. The fourth insulating layer 124 may be disposed on the third insulating layer 122 to extend along the profile of the third insulating layer 122. The fifth insulating layer 126 may fill a part of each of the second trench T2 and the third trench T3 remaining after each of the second trench T2 and the third trench T3 is filled with the third insulating layer 122 and the fourth insulating layer 124.

In some embodiments, the fourth insulating layer 124 may include a different material from the third insulating layer 122, and the fifth insulating layer 126 may include a different material from the fourth insulating layer 124. For example, the third insulating layer 122 may include silicon oxide, the fourth insulating layer 124 may include silicon nitride, and the fifth insulating layer 126 may include silicon oxide.

Since the boundary between the cell region CELL and the boundary region INTERFACE is clearly defined in the semiconductor device according to the embodiments, product reliability can be improved. For example, the first boundary patterns IP1 including the first boundary surfaces CS1 may clearly define the boundary between the cell region CELL and the boundary region INTERFACE arranged in the first direction D1. In addition, the second boundary patterns IP2 including the second boundary surfaces CS2 may clearly define the boundary between the cell region CELL and the boundary region INTERFACE arranged in the second direction D2. Accordingly, since a short circuit between active regions adjacent to the boundary region INTERFACE can be prevented, a semiconductor device with improved product reliability can be provided.

Figure 7:
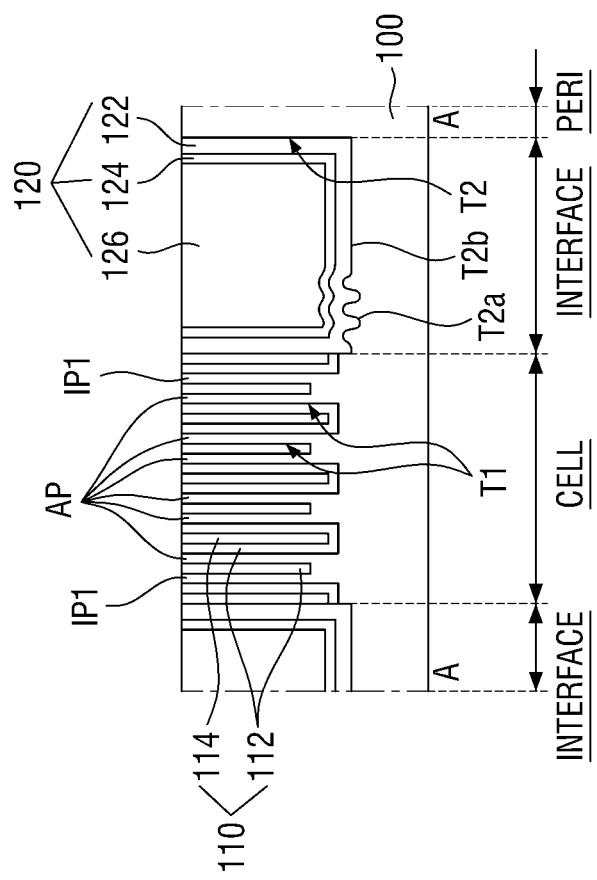
FIGS. 7 through 9 are various cross-sectional views of semiconductor devices according to embodiments.
Figure 8:
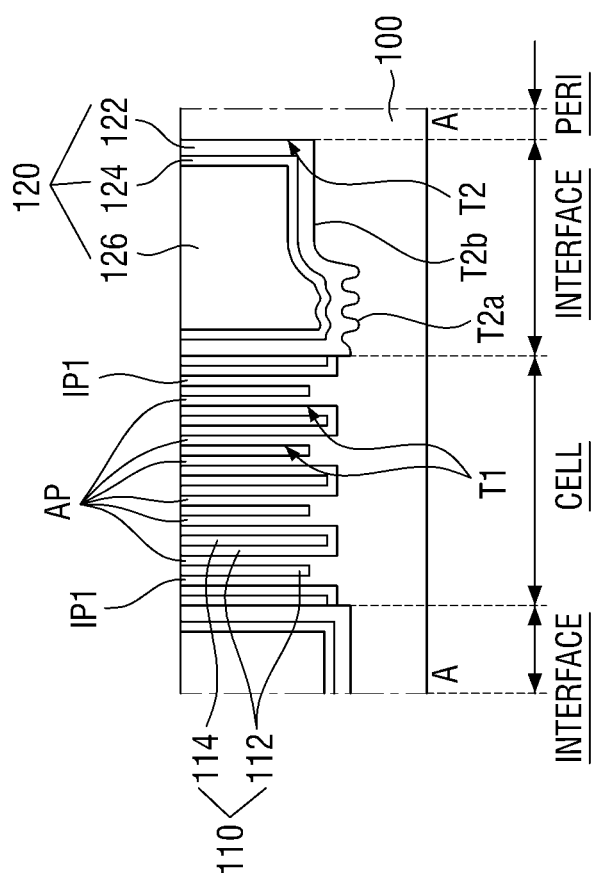
Figure 9:
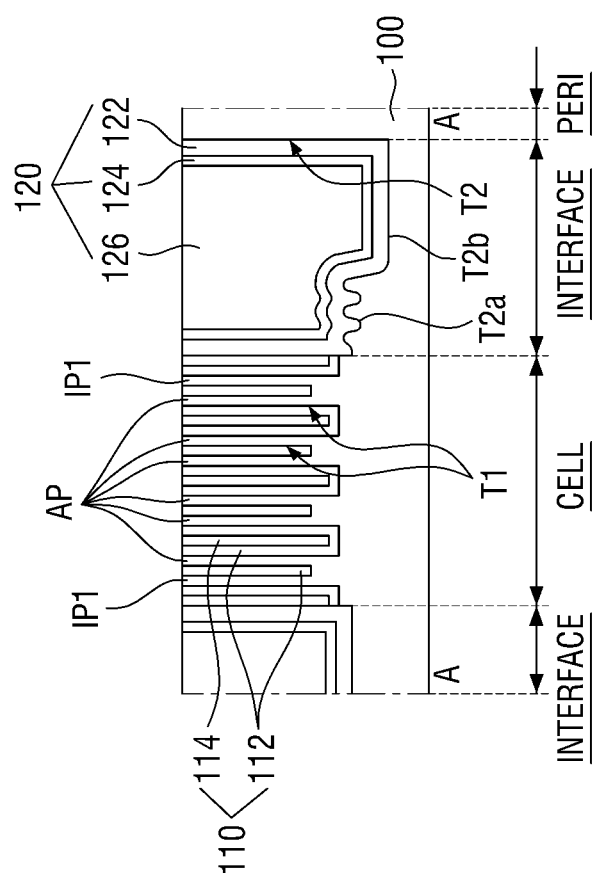

FIGS. 7 through 9 are various cross-sectional views of semiconductor devices according to embodiments. For reference, FIGS. 7 through 9 are various cross-sectional views taken along line A-A of FIGS. 1 and 2. For ease of description, a redundant description of elements and features identical to those described using FIGS. 1 through 6 will be given briefly or omitted.

Referring to FIG. 7, in a semiconductor device according to embodiments, a bottom surface of a second trench T2 includes a wavy first bottom surface T2a and a flat second bottom surface T2b.

The first bottom surface T2a of the second trench T2 may be adjacent to a cell region CELL. The second bottom surface T2b of the second trench T2 may be farther from the cell region CELL than the first bottom surface T2a. For example, the second bottom surface T2b of the second trench T2 may be adjacent to a peripheral region PERI.

The first bottom surface T2a of the second trench T2 may have a wavy shape. Accordingly, a bottom surface of a second element isolation layer 120 formed on the first bottom surface T2a may have a wavy shape corresponding to the wavy shape of the first bottom surface T2a. When the second element isolation layer 120 is formed as a multilayer, a third insulating layer 122 and a fourth insulating layer 124 formed on the first bottom surface T2a may have a wavy shape corresponding to the wavy shape of the first bottom surface T2a.

The second bottom surface T2b of the second trench T2 may have a flat shape. Accordingly, the bottom surface of the second element isolation layer 120 formed on the second bottom surface T2b may have a flat shape corresponding to the flat shape of the second bottom surface T2b. When the second element isolation layer 120 is formed as a multilayer, the third insulating layer 122 and the fourth insulating layer 124 formed on the second bottom surface T2b may have a flat shape corresponding to the flat shape of the second bottom surface T2b.

Referring to FIG. 8, in a semiconductor device according to embodiments, a first bottom surface T2a of a second trench T2 is lower than a second bottom surface T2b of the second trench T2.

For example, a height of a peak of the wavy first bottom surface T2a may be lower than a height of the flat second bottom surface T2b. In some embodiments, the second bottom surface T2b of the second trench T2 may be higher than a bottom surface of a first trench T1.

Referring to FIG. 9, in a semiconductor device according to embodiments, a first bottom surface T2a of a second trench T2 is higher than a second bottom surface T2b of the second trench T2.

For example, a height of a valley of the wavy first bottom surface T2a may be higher than a height of the flat second bottom surface T2b. In some embodiments, the second bottom surface T2b of the second trench T2 may be lower than a bottom surface of a first trench T1.

The shape of the second trench T2 illustrated in FIGS. 7 through 9 may result from characteristics of an etching process for forming the second trench T2. This will be described in more detail later with reference to FIGS. 26 through 29.

Figure 10:
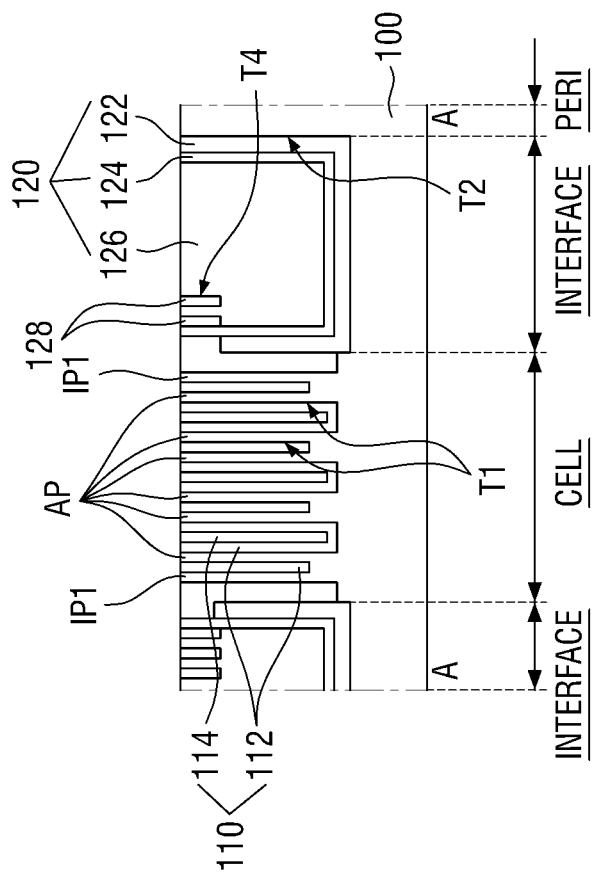
FIG. 10 is a cross-sectional view of a semiconductor device according to embodiments.

FIG. 10 is a cross-sectional view of a semiconductor device according to embodiments. For reference, FIG. 10 is a cross-sectional view taken along line A-A of FIGS. 1 and 2. For ease of description, a redundant description of elements and features identical to those described using FIGS. 1 through 6 will be given briefly or omitted.

Referring to FIG. 10, in the semiconductor device according to the embodiments, a second element isolation layer 120 further includes a sixth insulating layer 128 in a fourth trench T4.

The fourth trench T4 may be adjacent to a cell region CELL. In addition, the fourth trench T4 may be formed in an upper part of the second element isolation layer 120. In some embodiments, a plurality of fourth trenches T4 may be formed in the second element isolation layer 120. The sixth insulating layer 128 may be formed to fill the fourth trenches T4.

The sixth insulating layer 128 may include, but is not limited to, at least one of silicon oxide, silicon nitride, silicon oxynitride, and combinations of the same.

The shape of the sixth insulating layer 128 illustrated in FIG. 10 may result from characteristics of an etching process for forming the fourth trenches T4. This will be described in more detail later with reference to FIGS. 37 and 38.

Figure 11:
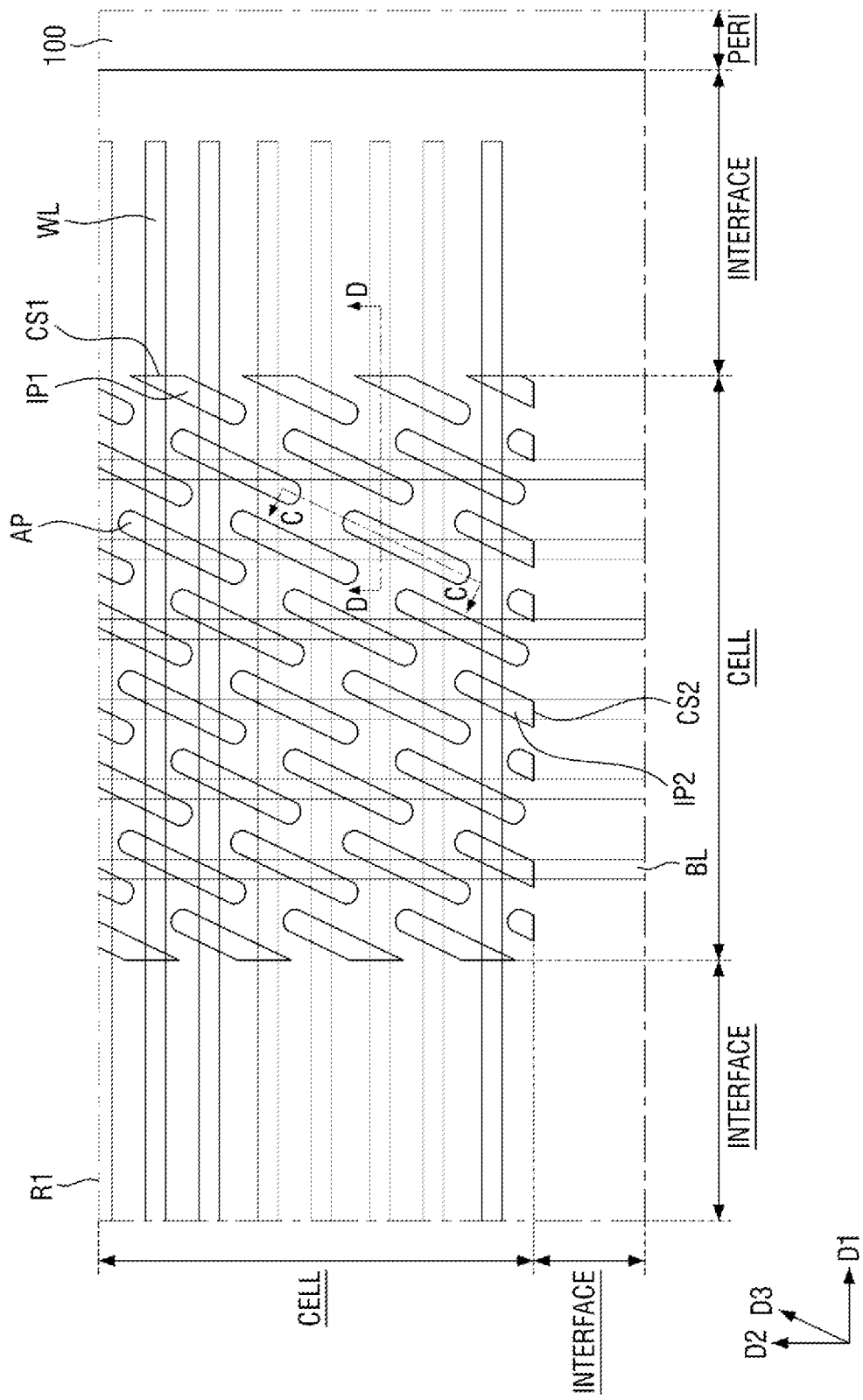
FIG. 11 is a layout view of a semiconductor device according to embodiments.
Figure 12:
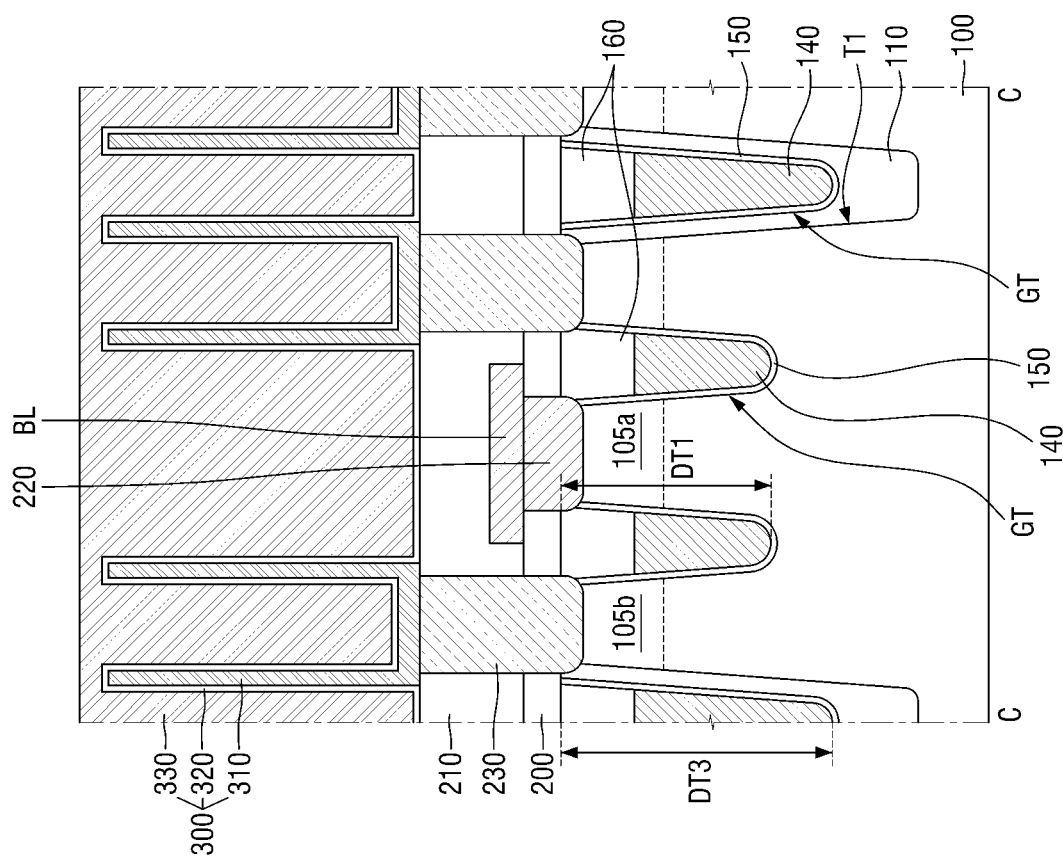
FIG. 12 is a cross-sectional view taken along line C-C of FIG. 11.
Figure 13:
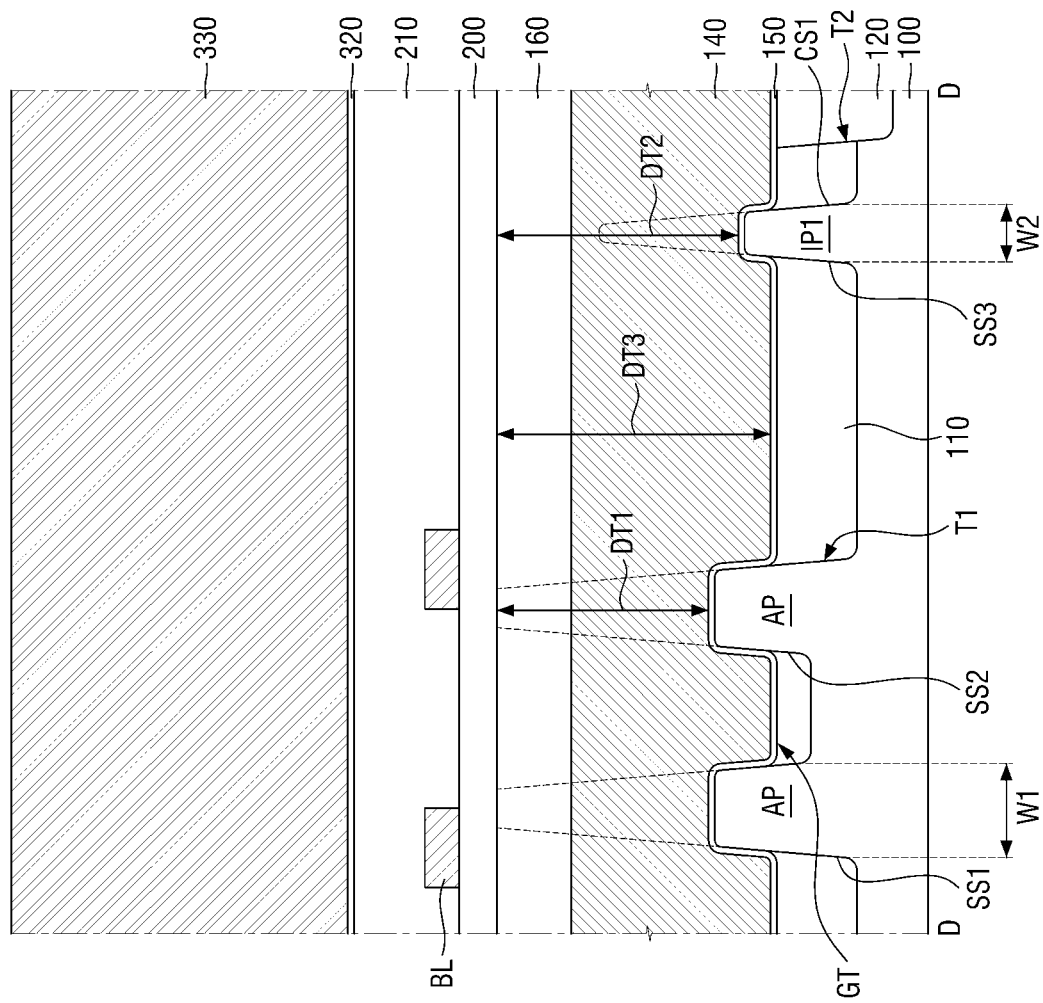
FIG. 13 is a cross-sectional view taken along line D-D of FIG. 11.

FIG. 11 is a layout view of a semiconductor device according to embodiments. FIG. 12 is a cross-sectional view taken along line C-C of FIG. 11. FIG. 13 is a cross-sectional view taken along line D-D of FIG. 11. For reference, FIG. 11 is an enlarged view of region R1 of FIG. 1. For ease of description, a redundant description of elements and features identical to those described using FIGS. 1 through 10 will be given briefly or omitted.

In FIGS. 11 through 13, a dynamic random access memory (DRAM) is illustrated as an example of the semiconductor device according to the embodiments. However, this is merely an example. For example, the present disclosure is applicable to various semiconductor devices formed using the active patterns AP, the first boundary patterns IP1 and/or the second boundary patterns IP2 described above with reference to FIGS. 1 through 10.

Referring to FIGS. 11 through 13, the semiconductor device according to the embodiments includes word lines WL (gate electrodes 140), gate dielectric layers 150, gate capping patterns 160, bit lines BL, a first interlayer insulating film 200, a second interlayer insulating film 210, first contact structures 220, second contact structures 230, and capacitor structures 300.

Each of the word lines WL may cross a plurality of active patterns AP and a first boundary pattern IP1. For example, the word lines WL may extend in the first direction D1. The word lines WL may extend parallel to each other. In addition, the word lines WL may be spaced apart from each other by equal distances in the second direction D2. In some embodiments, some of the word lines WL may also extend in the first direction D1 across a plurality of second boundary patterns IP2.

In some embodiments, the word lines WL may be formed in a substrate 100. For example, the substrate 100 may include gate trenches GT. The gate trenches GT may cross the active patterns AP, the first boundary patterns IP1, the second boundary patterns IP2, and a first element isolation layer 110. For example, the gate trenches GT may extend in the first direction D1. The gate electrodes 140 may be formed in the gate trenches GT. Accordingly, the gate electrodes 140 may be buried in the active patterns AP, the first boundary patterns IP1, the second boundary patterns IP2 and the first element isolation layer 110 to function as the word lines WL.

In FIG. 12, each of the gate trenches GT has sloping sidewalls. However, this is merely a characteristic of an etching process for forming the gate trenches GT, and the present disclosure is not limited to this case.

In some embodiments, the word lines WL may extend beyond a cell region CELL to a boundary region INTERFACE. For example, as illustrated in FIG. 11, a part of each of the word lines WL may be disposed in the boundary region INTERFACE. Accordingly, as illustrated in FIG. 13, a part of each of the gate electrodes 140 may cross a second element isolation layer 120.

The gate electrodes 140 may include a conductive material. For example, the gate electrodes 140 may include at least one of metals, such as titanium (Ti), tantalum (Ta), aluminum (Al) and cobalt (Co), and combinations of the same. Alternatively, for example, the gate electrodes 140 may include polysilicon or silicon germanium other than a metal.

In some embodiments, bottom surfaces of the gate trenches GT in the active patterns AP, the first boundary patterns IP1, and the second boundary patterns IP2 may be higher than bottom surfaces of the gate trenches GT in the first element isolation layer 110. For example, as illustrated in FIG. 13, a first depth DT1 of a gate electrode 140 overlapping active patterns AP and a second depth DT2 of the gate electrode 140 overlapping a first boundary pattern IP1 may be smaller than a third depth DT3 of the gate electrode 140 overlapping the first element isolation layer 110.

In some embodiments, the bottom surfaces of the gate trenches GT in the active patterns AP may be higher than the bottom surfaces of the gate trenches GT in the first boundary patterns IP1 and the second boundary patterns IP2. For example, as illustrated in FIG. 13, the first depth DT1 of a gate electrode 140 overlapping active patterns AP may be smaller than the second depth DT2 of the gate electrode 140 overlapping a first boundary pattern IP1.

The gate dielectric layers 150 may be interposed between the active patterns AP and the gate electrodes 140, between the first boundary patterns IP1 and the gate electrodes 140, and between the second boundary patterns IP2 and the gate electrodes 140. For example, the gate dielectric layers 150 may extend conformally along the sidewalls and bottom surfaces of the gate trenches GT.

The gate dielectric layers 150 may include at least one of, for example, silicon oxide, silicon nitride, silicon oxynitride, and a high dielectric constant (high-k) material having a higher dielectric constant than silicon oxide.

The gate capping patterns 160 may be formed on the gate electrodes 140. For example, a gate capping pattern 160 may fill a part of each gate trench GT remaining after the gate trench GT is filled with a gate dielectric layer 150 and a gate electrode 140.

The gate capping patterns 160 may include, but are not limited to, at least one of silicon oxide, silicon nitride, silicon oxynitride, and combinations of the same.

In some embodiments, each of the active patterns AP may include a first source/drain region 105a and a second source/drain region 105b. The first source/drain region 105a and the second source/drain region 105b may be formed in an active pattern AP on both sides of a gate electrode 140.

For example, as illustrated in FIGS. 11 and 12, the first source/drain region 105a may be formed at the center of each active pattern AP, and the second source/drain region 105b may be formed at both ends of the active pattern AP. In some embodiments, two gate electrodes 140 may share one first source/drain region 105a.

The bit lines BL may intersect the word lines WL. For example, the bit lines BL may extend in the second direction D2. The bit lines BL may extend parallel to each other. In addition, the bit lines BL may be spaced apart from each other by equal distances in the first direction D1. In an example embodiment, the bit lines BL may be disposed between two first boundary patterns IP1 spaced apart from each other in the first direction D1. For example, each of the bit lines BL may overlap a corresponding column of the active patterns AP between the two first boundary patterns IP1.

In some embodiments, the bit lines BL may extend beyond the cell region CELL to the boundary region INTERFACE. For example, as illustrated in FIG. 11, a part of each of the bit lines BL may be disposed in the boundary region INTERFACE. Accordingly, a part of each of the bit lines BL may be formed on the second element isolation layer 120.

Each of the bit lines BL may be a single layer made of one type of conductive material or may be a multilayer made of a combination of multiple types of conductive materials. For example, each of the bit lines BL may be a multilayer including a polysilicon layer, a nitride layer (e.g., TiSiN), and a metal layer (e.g., tungsten (W)) sequentially stacked on the active patterns AP.

The first interlayer insulating film 200 and the second interlayer insulating film 210 may be sequentially stacked on the active patterns AP, the first boundary patterns IP1 and the second boundary patterns IP2. In FIGS. 12 and 13, only two interlayer insulating films 200 and 210 are formed. However, this is merely an example. For example, three or more interlayer insulating films may be formed on the active patterns AP, the first boundary patterns IP1 and the second boundary patterns IP2.

The first interlayer insulating film 200 and the second interlayer insulating film 210 may include, but are not limited to, at least one of silicon oxide, silicon nitride, silicon oxynitride, and a low-k material having a lower dielectric constant than silicon oxide.

The first contact structures 200 may be connected to the first source/drain regions 105a. For example, the first contact structures 220 may pass through the first interlayer insulating film 200 so as to be connected to the first source/drain regions 105a.

The second contact structures 230 may be spaced apart from the first contact structures 220. The second contact structures 230 may be connected to the second source/drain regions 105b. For example, the second contact structures 230 may pass through the first interlayer insulating film 200 and the second interlayer insulating film 210 so as to be connected to the second source/drain regions 105b.

Each of the first contact structures 220 and the second contact structures 230 may include a conductive material. For example, each of the first contact structures 220 and the second contact structures 230 may include at least one of metals, such as titanium (Ti), tantalum (Ta), tungsten (W), aluminum (Al) and cobalt (Co), and combinations of the same. Alternatively, for example, each of the first contact structures 220 and the second contact structures 230 may include polysilicon or silicon germanium other than a metal.

Each of the first contact structures 220 and the second contact structures 230 may be a single layer made of one type of conductive material or may be a multilayer made of a combination of multiple types of conductive materials. For example, each of the second contact structures 230 may be a multilayer including a polysilicon layer and a metal layer (e.g., tungsten (W)) sequentially stacked on a second source/drain region 105b.

The bit lines BL may be connected to the first contact structures 220. For example, the bit lines BL may be formed on an upper surface of the first interlayer insulating film 200 and upper surfaces of the first contact structures 220. Accordingly, the bit lines BL may be electrically connected to the first source/drain regions 105a.

The capacitor structures 300 may be connected to the second contact structures 230. For example, the capacitor structures 300 may be formed on an upper surface of the second interlayer insulating film 210 and upper surfaces of the second contact structures 230. Accordingly, the capacitor structures 300 may be electrically connected to the second source/drain regions 105b.

The capacitor structures 300 may store information in the semiconductor device (e.g., a semiconductor memory device) according to the embodiments. For example, each of the capacitor structures 300 may include a lower electrode 310, a capacitor dielectric layer 320, and an upper electrode 330. Each of the capacitor structures 300 may store electric charge in the capacitor dielectric layer 320 by using a potential difference between the lower electrode 310 and the upper electrode 330.

Each of the lower electrode 310 and the upper electrode 330 may include, but is not limited to, doped polysilicon, a metal, or a metal nitride. The capacitor dielectric layer 320 may include, but is not limited to, at least one of silicon oxide and a high-k material having a higher dielectric constant than silicon oxide.

In some embodiments, a first acute angle θ1 may be 60 degrees. In this case, the capacitor structures 300 may be arranged in a honeycomb shape. However, this is merely an example, and the capacitor structures 300 can be arranged in various shapes.

Semiconductor devices according to embodiments will now be described with reference to FIGS. 1 through 39.

FIGS. 14 through 30 are views illustrating steps of a method of fabricating a semiconductor device according to embodiments. For ease of description, a redundant description of elements and features identical to those described using FIGS. 1 through 10 will be given briefly or omitted.

Figure 14:
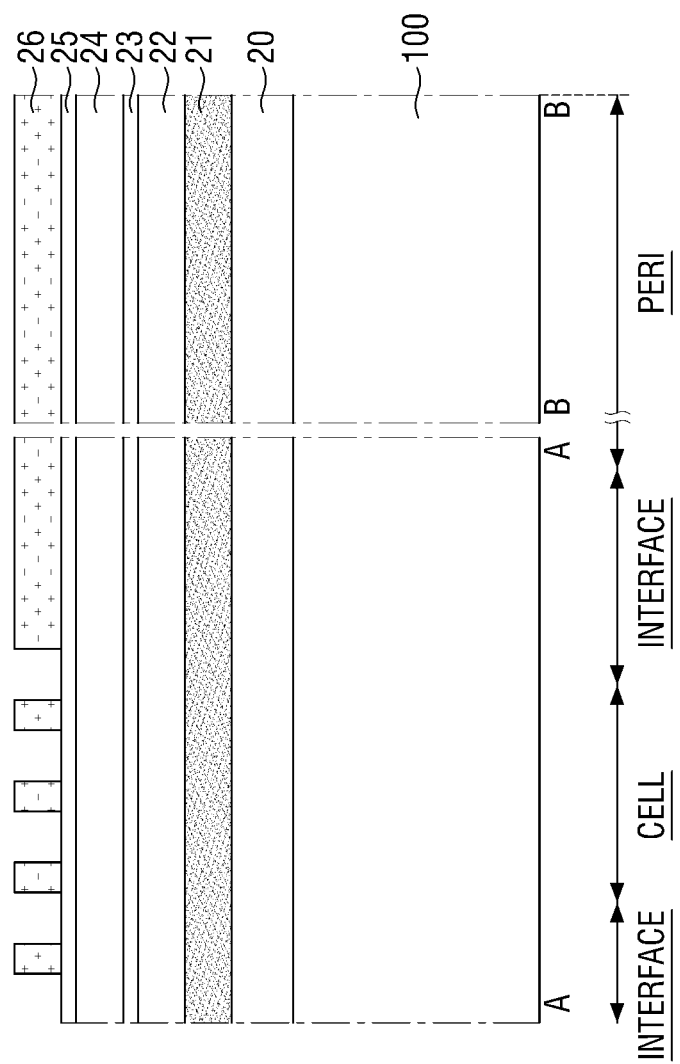
FIGS. 14 through 30 are views illustrating steps of a method of fabricating a semiconductor device according to embodiments.

Referring to FIG. 14, a first material layer 20, a first mask layer 21, a second material layer 22, a second mask layer 23, a third material layer 24, a third mask layer 25, and a first photoresist 26 are sequentially formed on a substrate 100.

The substrate 100 may have, but is not limited to, a structure in which a base substrate and an epitaxial layer are stacked. The substrate 100 may be a silicon substrate, a gallium arsenide substrate, a silicon germanium substrate, or a semiconductor-on-insulator (SOI) substrate. By way of example, the substrate 100 will be described below as a silicon substrate.

The first material layer 20 may be formed on the substrate 100. The first material layer 20 may include a material having etch selectivity with respect to the substrate 100. For example, when the substrate 100 includes silicon, the first material layer 20 may include a silicon oxide layer.

The first mask layer 21 may be formed on the first material layer 20. The first mask layer 21 may include a material having etch selectivity with respect to the first material layer 20. For example, when the first material layer 20 includes a silicon oxide layer, the first mask layer 21 may include a polysilicon layer.

The second material layer 22 may be formed on the first mask layer 21. The second material layer 22 may include, for example, a carbon-based material layer. For example, the second material layer 22 may include an amorphous carbon layer (ACL) or a spin-on-hard mask (SOH) material layer.

The second mask layer 23 may be formed on the second material layer 22. The second mask layer 23 may include a material having etch selectivity with respect to the second material layer 22. For example, when the second material layer 22 includes a carbon-based material layer, the second mask layer 23 may include a silicon oxide layer, a silicon nitride layer, or a silicon oxynitride layer.

The third material layer 24 may be formed on the second mask layer 23. The third material layer 24 may include, for example, a carbon-based material layer. For example, the third material layer 24 may include an ACL or an SOH material layer.

The third mask layer 25 may be formed on the third material layer 24. The third mask layer 25 may include a material having etch selectivity with respect to the third material layer 24. For example, when the third material layer 24 includes a carbon-based material layer, the third mask layer 25 may include a silicon oxide layer, a silicon nitride layer, or a silicon oxynitride layer.

The first photoresist 26 may be formed on the third mask layer 25. The first photoresist 26 may be a photoresist pattern formed by, for example, a photolithography process.

The substrate 100 may include a cell region CELL, a peripheral region PERI, and a boundary region INTERFACE. In some embodiments, the first photoresist 26 on the cell region CELL may be in the shape of a plurality of bars extending parallel to each other in a direction (e.g., the third direction D3 of FIG. 2). Only cross-sections, taken in the first direction D1, of the plurality of bars are shown in FIG. 14. However, for simplicity of drawing, extending portions thereof in the third direction D3 between the first and second directions D1 and D2 are omitted. In some embodiments, at least a part of the first photoresist 26 may expose the boundary region INTERFACE. In some embodiments, the first photoresist 26 may cover the peripheral region PERI.

Figure 15:
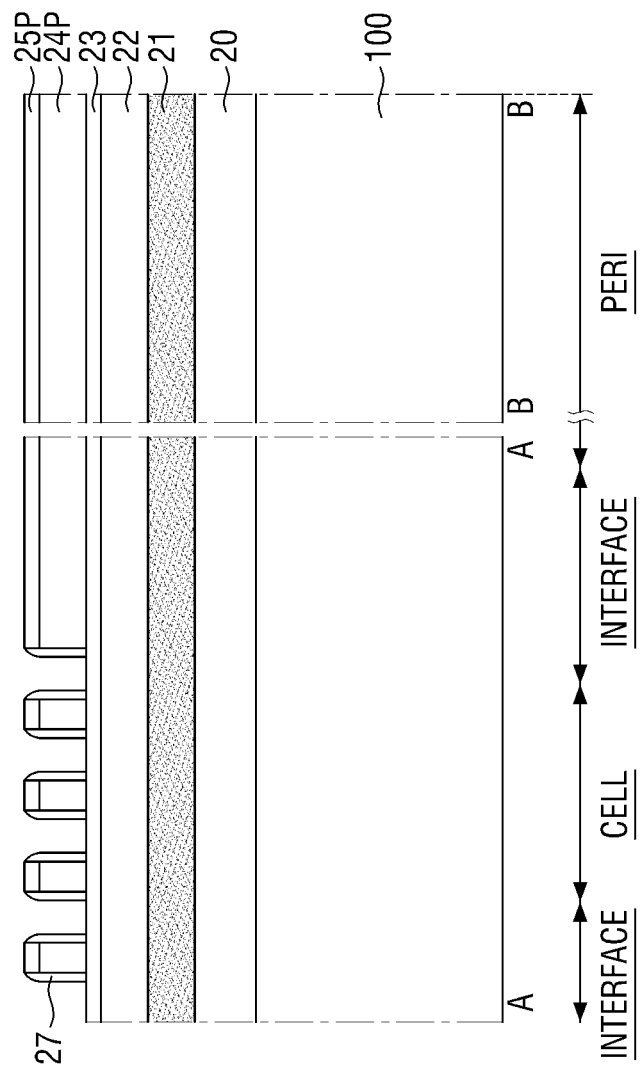

Referring to FIG. 15, the third mask layer 25 and the third material layer 24 are patterned to form first mask patterns 25P and first material patterns 24P.

For example, the first mask patterns 25P may be formed by patterning the third mask layer 25 using the first photoresist 26 as an etch mask. Then, the first material patterns 24P may be formed by patterning the third material layer 24 using the first mask patterns 25P as an etch mask. The patterning of the third mask layer 25 and the third material layer 24 may be performed by, for example, an anisotropic etching process.

Next, first spacers 27 are formed on side surfaces of the first mask patterns 250P and/or the first material patterns 24P.

For example, a preliminary spacer layer may be formed to extend along the profiles of the second mask layer 23, the first mask patterns 25P, and the first material patterns 24P. Then, an anisotropic etching process may be performed on the preliminary spacer layer. Accordingly, the first spacers 27 may be formed on the side surfaces of the first mask patterns 25P and the first material patterns 24P.

The first spacers 27 may include, but are not limited to, at least one of silicon oxide, silicon nitride, silicon oxynitride, and combinations of the same.

Figure 16:
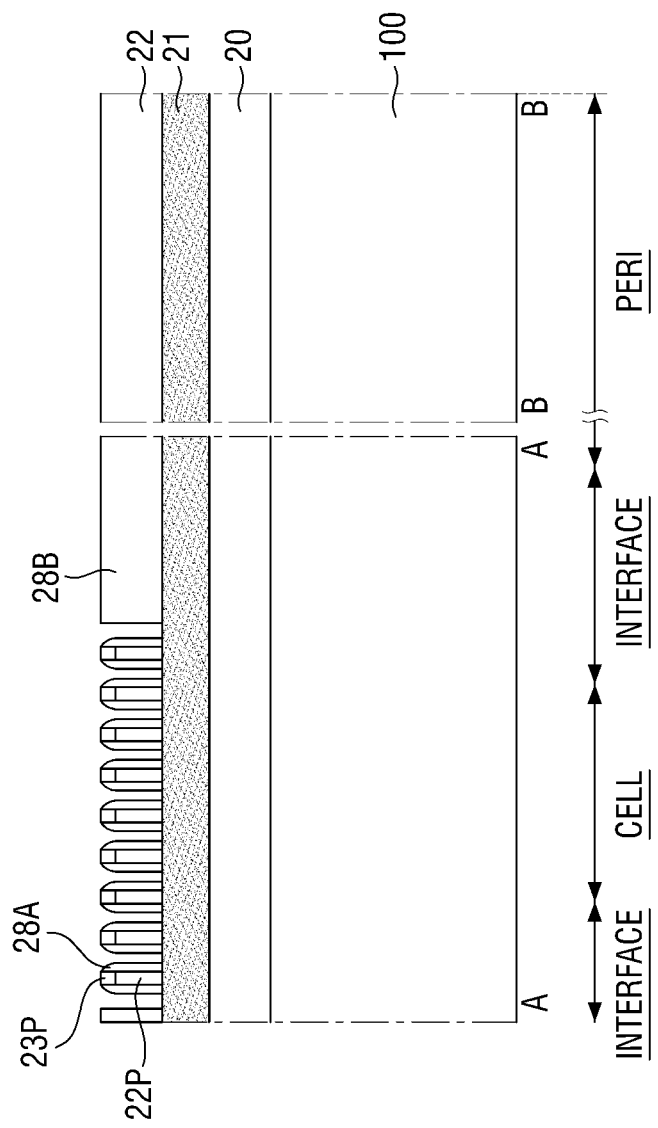

Referring to FIG. 16, the second mask layer 23 and the second material layer 22 are patterned to form second mask patterns 23P and second material patterns 22P.

For example, the second mask patterns 23P may be formed by patterning the second mask layer 23 using the first spacers 27 as an etch mask. Then, the second material patterns 22P may be formed by patterning the second material layer 22 using the second mask patterns 23P as an etch mask. The patterning of the second mask layer 23 and the second material layer 22 may be performed by, for example, an anisotropic etching process.

Next, second spacers 28A are formed on opposite side surfaces of the second mask patterns 23P and/or the second material patterns 22P.

For example, a preliminary spacer layer may be formed to extend along the profiles of the first mask layer 21, the second mask patterns 23P, and the second material patterns 22P. Then, an anisotropic etching process may be performed on the preliminary spacer layer. Accordingly, the second spacers 28A may be formed on the opposite side surfaces of the second mask patterns 23P and the second material patterns 22P.

The second spacers 28A may include, but are not limited to, at least one of silicon oxide, silicon nitride, silicon oxynitride, and combinations of the same.

In some embodiments, a sacrificial pattern 28B may be further formed on the first mask layer 21 to cover a part of the boundary region INTERFACE and the peripheral region PERI.

Figure 17:
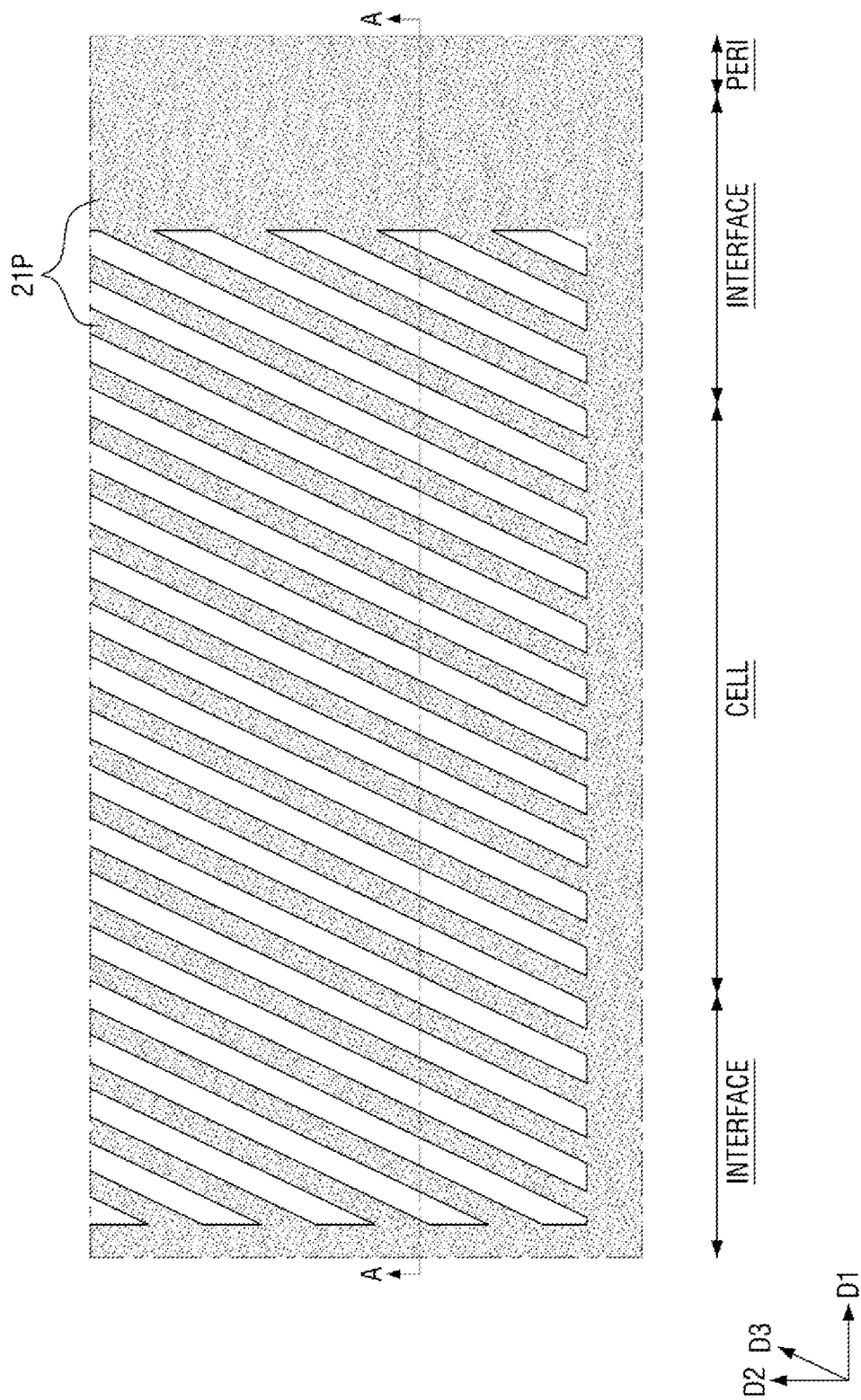
Figure 18:
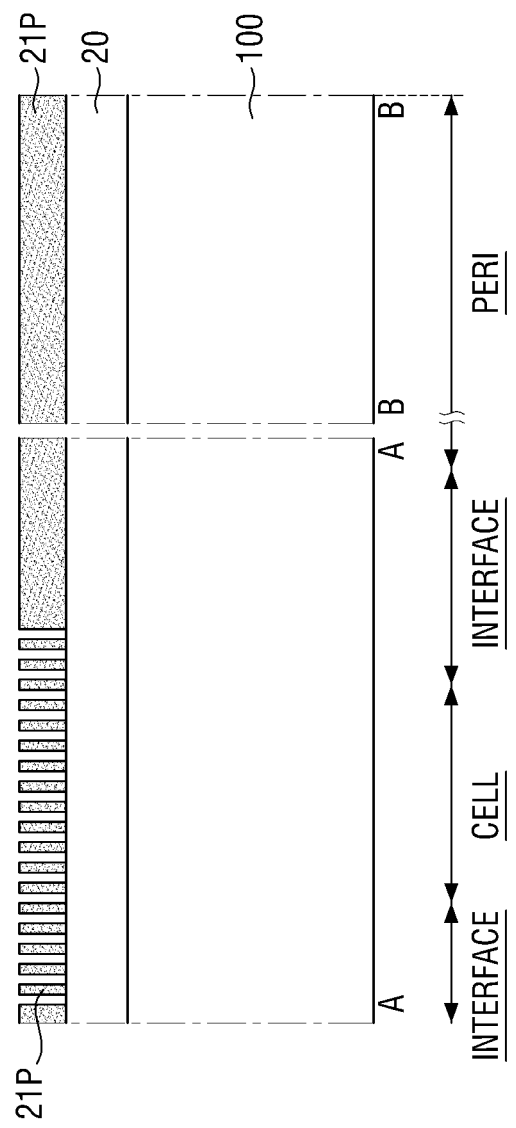

Referring to FIGS. 17 and 18, the first mask layer 21 is patterned to form a third mask pattern 21P.

For example, the third mask pattern 21P may be formed by patterning the first mask layer 21 using the second spacers 28A as an etch mask. For example, in some embodiments, the third mask pattern 21P may be formed by a quadruple patterning technology (QPT).

In some embodiments, since the first photoresist 26 (see FIG. 14) on the cell region CELL may be in the shape of a plurality of bars extending in the third direction D3, the third mask pattern 21P on the cell region CELL may also be in the shape of a plurality of bars extending in the third direction D3. In FIG. 18, for the simplicity of drawing, an extending portion of the third mask pattern 21P in the third direction D3 is omitted, and only cross-sections, taken in the first direction D1, of the third mask pattern 21P are shown.

In some embodiments, the third mask pattern 21P may expose at least a part of the boundary region INTERFACE. For example, as illustrated in FIG. 17, at least a part of the third mask pattern 21P in the shape of bars extending in the third direction D3 may extend to the boundary region INTERFACE adjacent to the cell region CELL.

Figure 19:
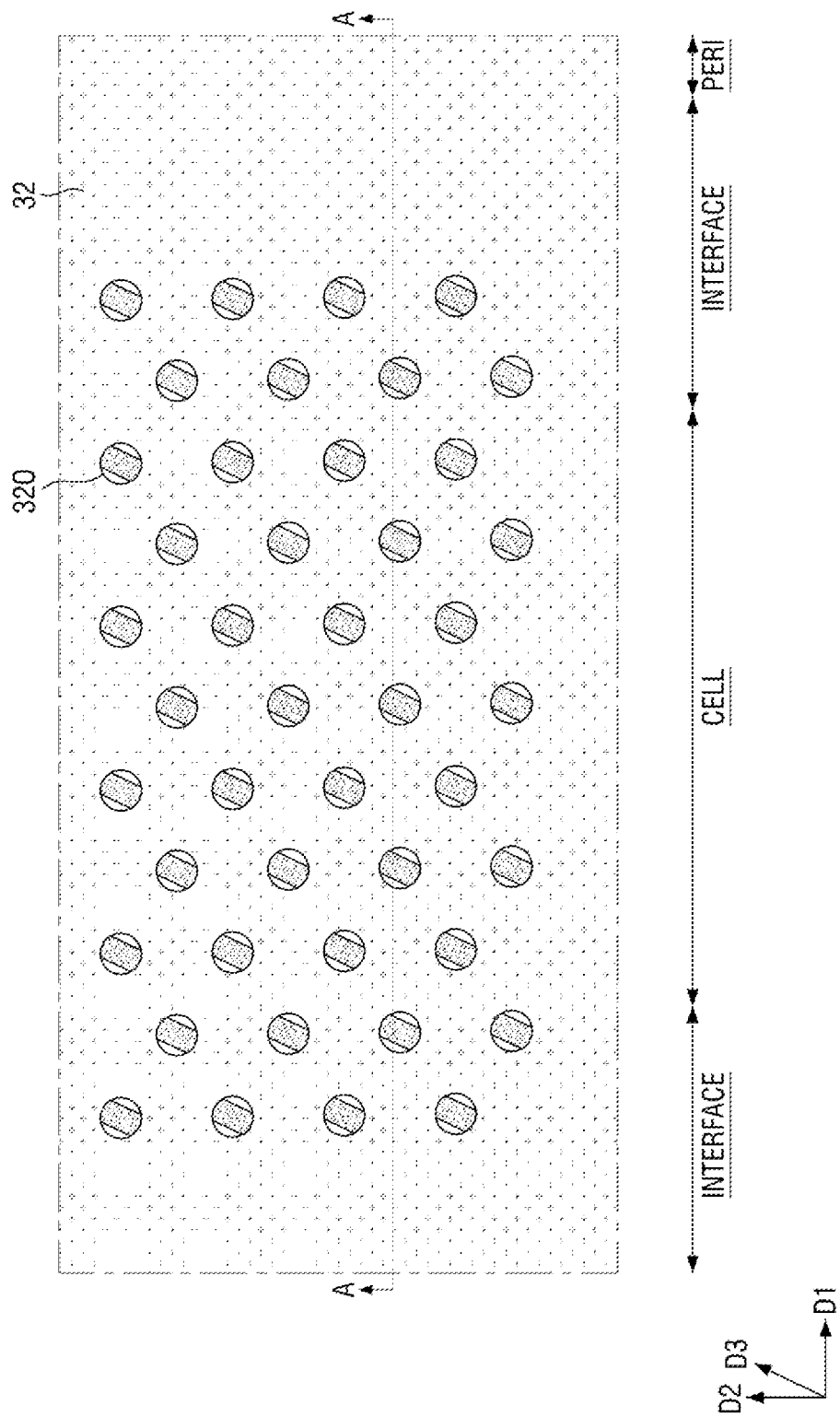
Figure 20:
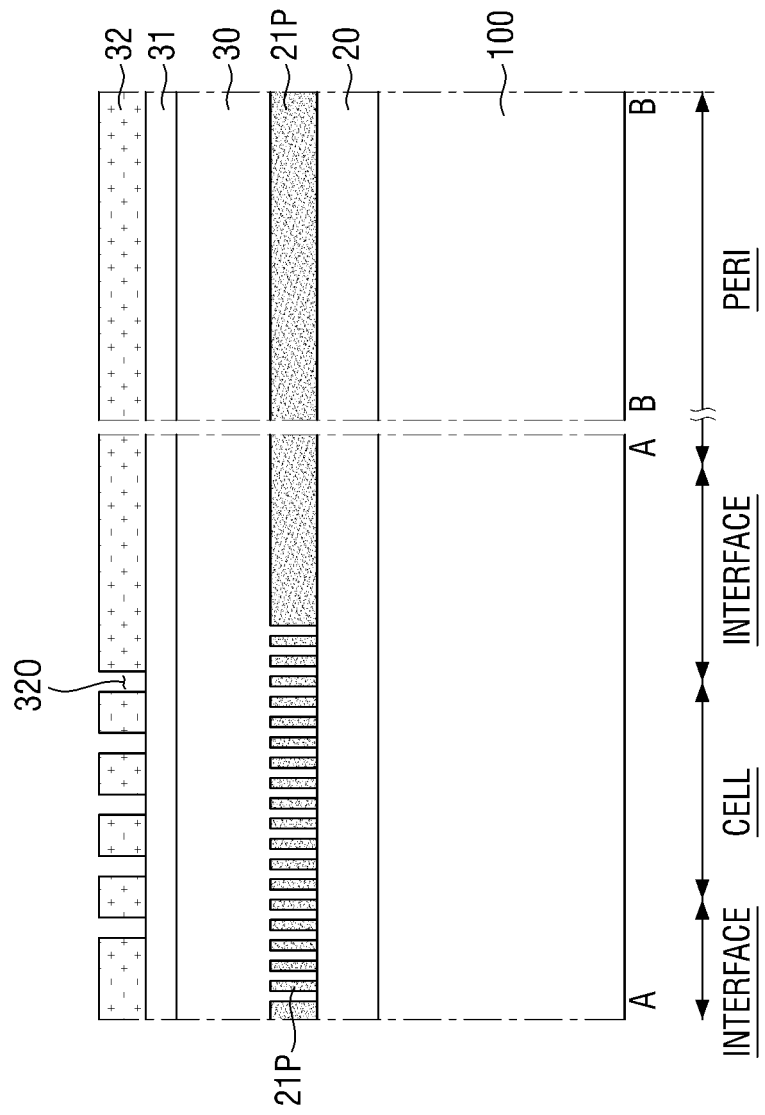

Referring to FIGS. 19 and 20, a fourth material layer 30, a fourth mask layer 31, and a second photoresist 32 are sequentially formed on the third mask pattern 21P.

The fourth material layer 30 may be formed on the third mask pattern 21P. The fourth material layer 30 may include, for example, a carbon-based material layer. For example, the fourth material layer 30 may include an ACL or an SOH material layer.

The fourth mask layer 31 may be formed on the fourth material layer 30. The fourth mask layer 31 may include a material having etch selectivity with respect to the fourth material layer 30. For example, when the fourth material layer 30 includes a carbon-based material layer, the fourth mask layer 31 may include a silicon oxide layer, a silicon nitride layer, or a silicon oxynitride layer.

The second photoresist 32 may be formed on the fourth mask layer 31. The second photoresist 32 may be a photoresist pattern formed by, for example, a photolithography process.

In some embodiments, the second photoresist 32 may expose a part of the third mask pattern 21P. For example, the second photoresist 32 may include a plurality of first openings 320 overlapping parts of the third mask pattern 21P. Although each of the first openings 320 is illustrated as being circular, this is merely an example, and the present disclosure is not limited to this case.

Figure 21:
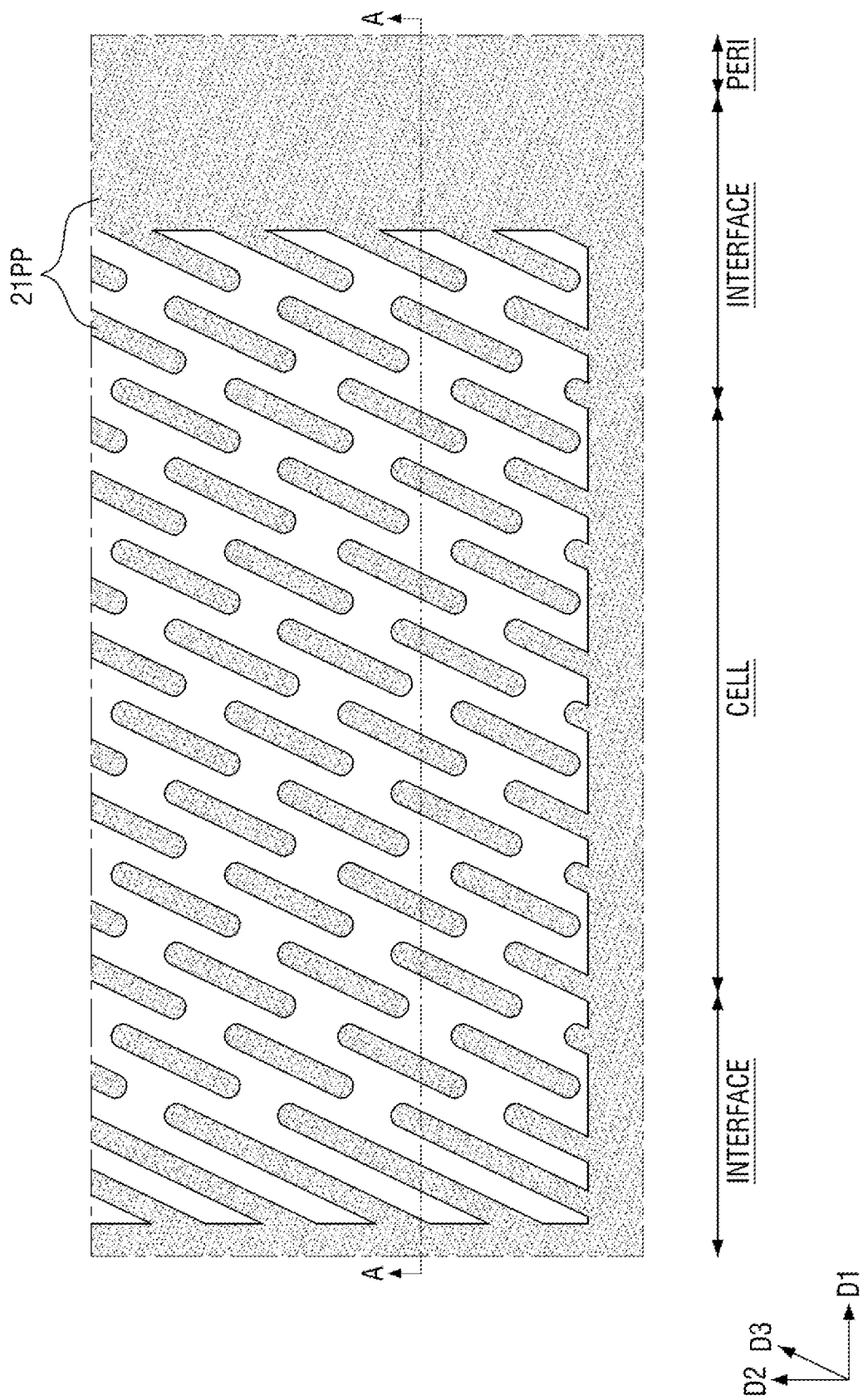
Figure 22:
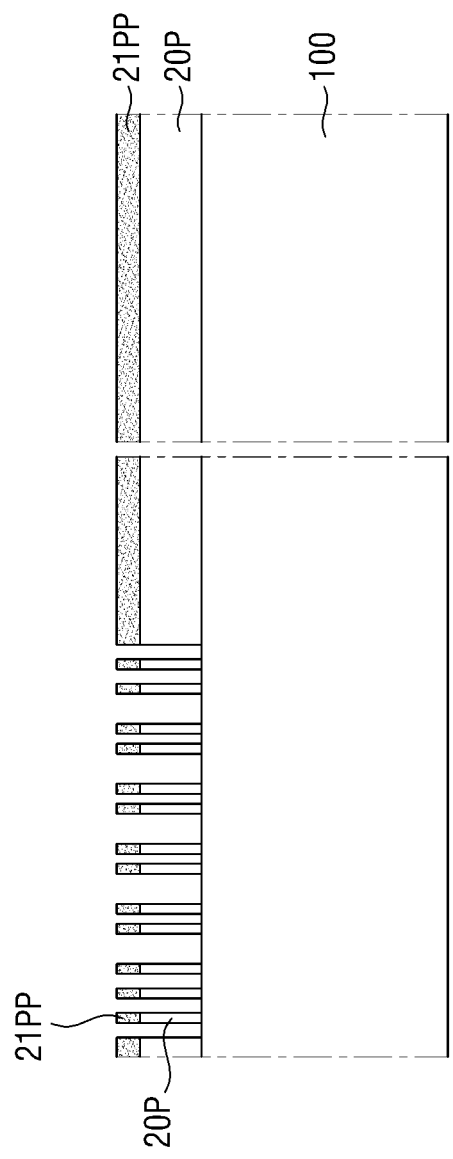

Referring to FIGS. 21 and 22, the third mask pattern 21P is patterned to form fourth mask patterns 21PP.

For example, the fourth mask layer 31 may be patterned using the second photoresist 32 as an etch mask. Then, the fourth material layer 30 may be patterned using the patterned fourth mask layer 31 as an etch mask. Then, the fourth mask patterns 21PP may be formed by patterning the third mask pattern 21P using the patterned fourth material layer 30 as an etch mask.

Accordingly, the third mask pattern 21P in the shape of bars extending in the third direction D3 may be cut into the fourth mask patterns 21PP in the shape of a plurality of bars extending parallel to each other in the third direction D3. In some embodiments, the center of one of the fourth mask patterns 21PP may be disposed adjacent to an end of another fourth mask pattern 21PP.

Next, the first material layer 20 is patterned using the fourth mask patterns 21PP as an etch mask, thereby forming third material patterns 20P.

Figure 23:
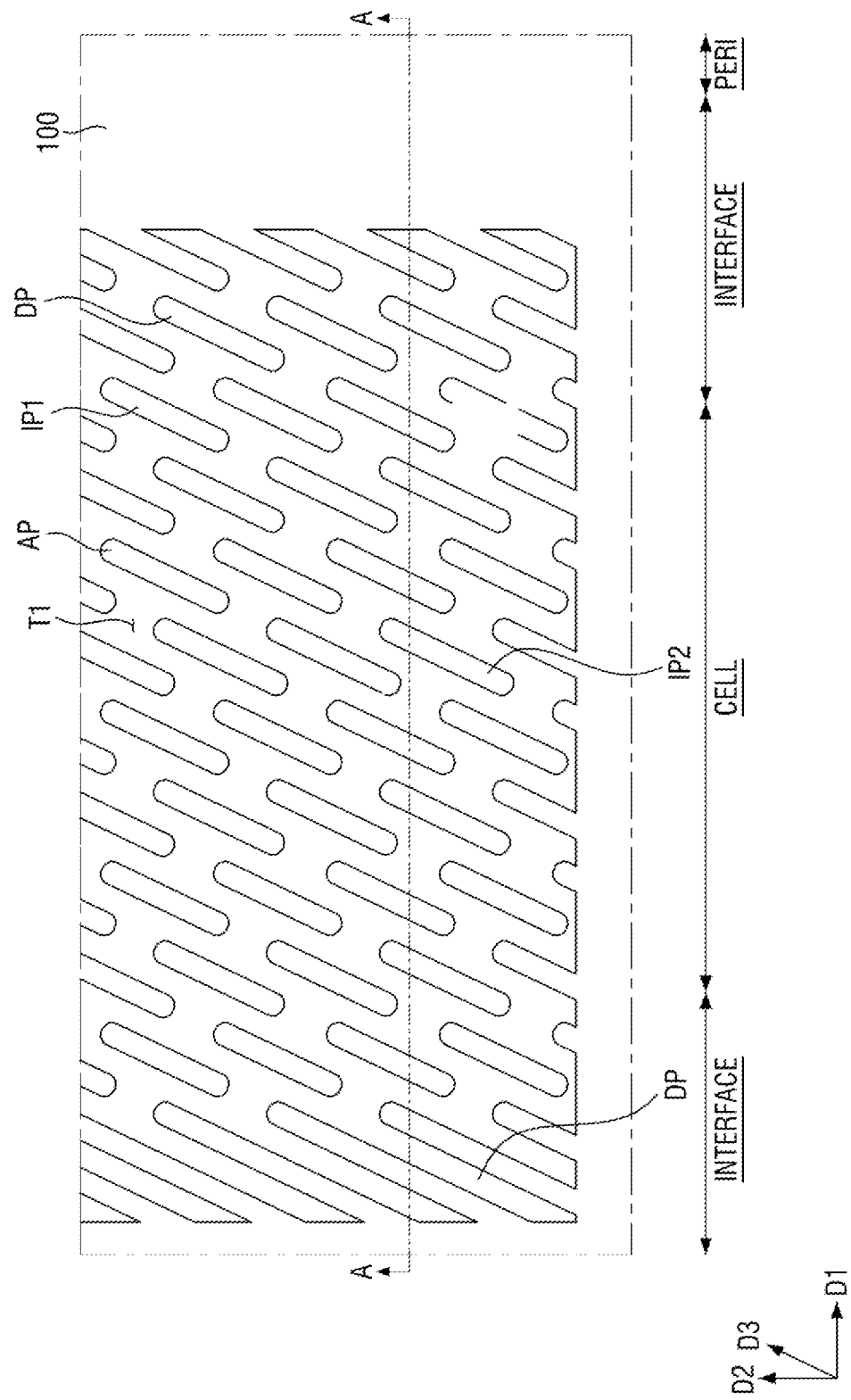
Figure 24:
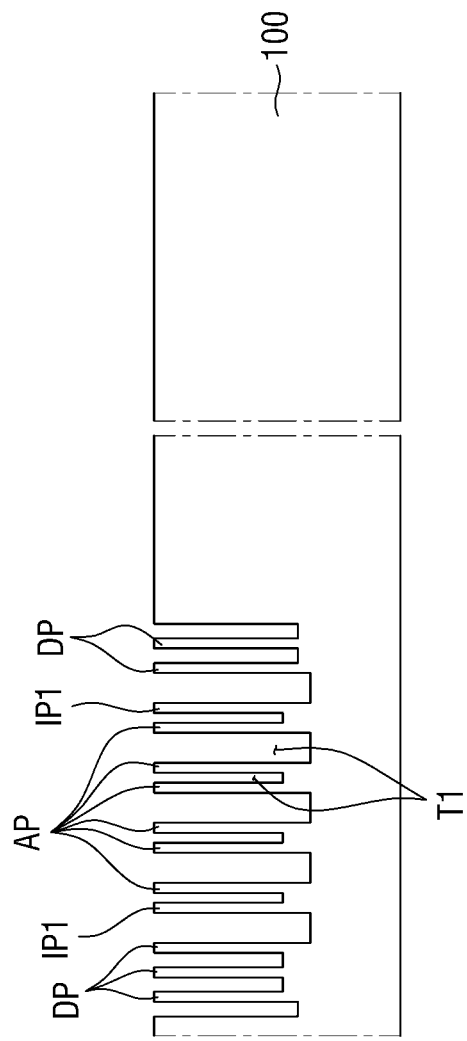

Referring to FIGS. 23 and 24, the substrate 100 is patterned using the third material patterns 20P as an etch mask.

For example, an etching process using the third material patterns 20P as an etch mask may be performed to form a first trench T1 in the substrate 100. Accordingly, a plurality of active patterns AP defined by the first trench T1 may be formed in the cell region CELL.

In some embodiments, since the third material patterns 20P may expose at least a part of the boundary region INTERFACE, the first trench T1 may also be formed in at least a part of the boundary region INTERFACE. For example, at least a part of the first trench T1 may be formed in the boundary region INTERFACE adjacent to the cell region CELL. Accordingly, a plurality of dummy patterns DP defined by the first trench T1 may be formed in the boundary region INTERFACE.

Figure 25:
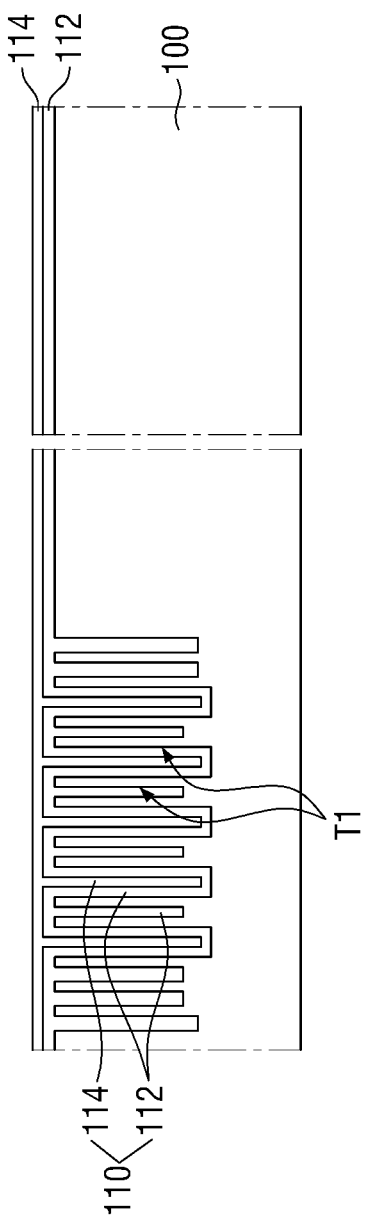

Referring to FIG. 25, a first element isolation layer 110 is formed in the first trench T1.

For example, a first insulating layer 112 and a second insulating layer 114 may be sequentially formed on the substrate 100 to fill the first trench T1. Accordingly, the first element isolation layer 110 may be formed in the substrate 100 to define the active patterns AP and the dummy patterns DP.

In some embodiments, the first insulating layer 112 may include silicon oxide, and the second insulating layer 114 may include silicon nitride.

Figure 26:
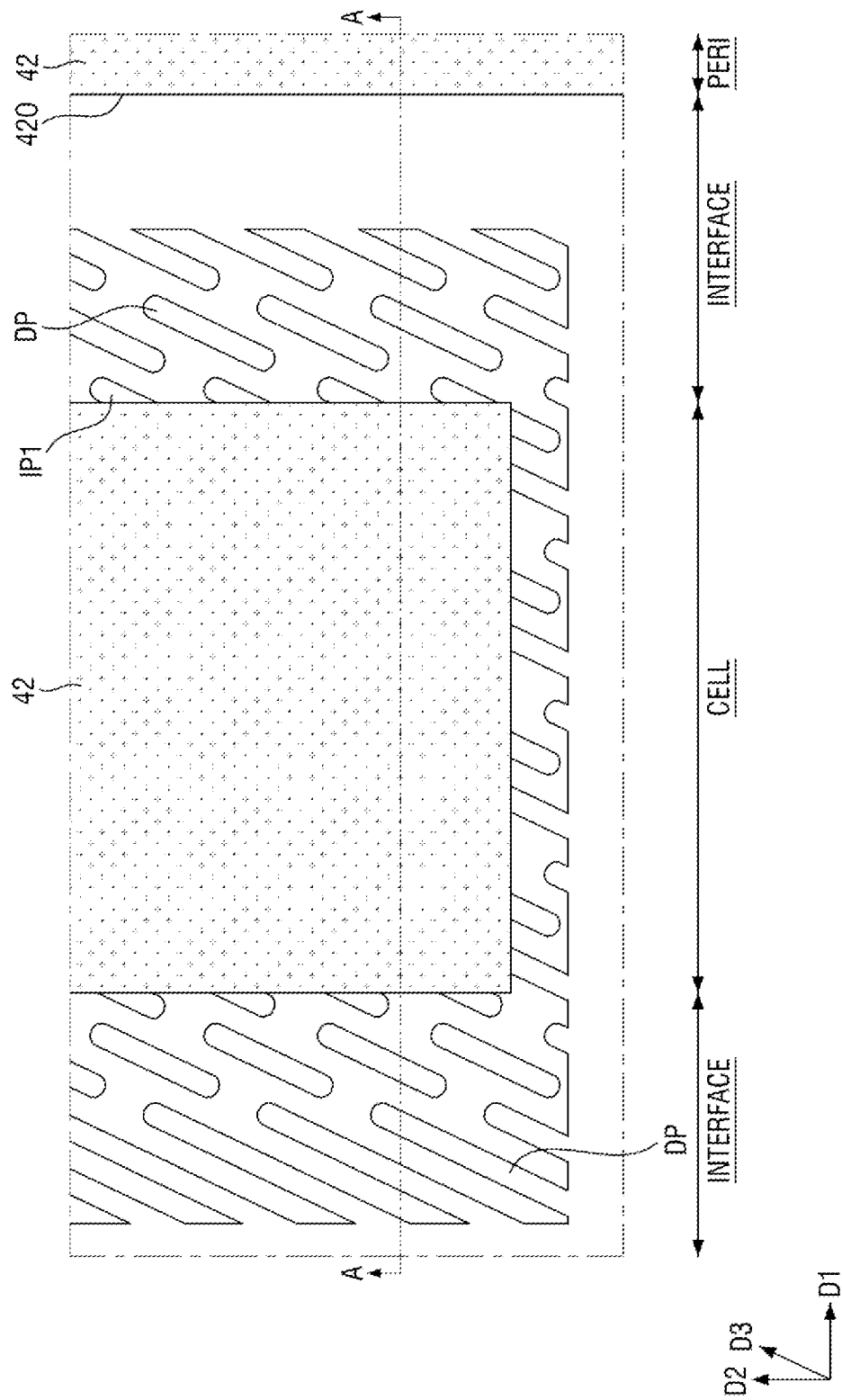
Figure 27:
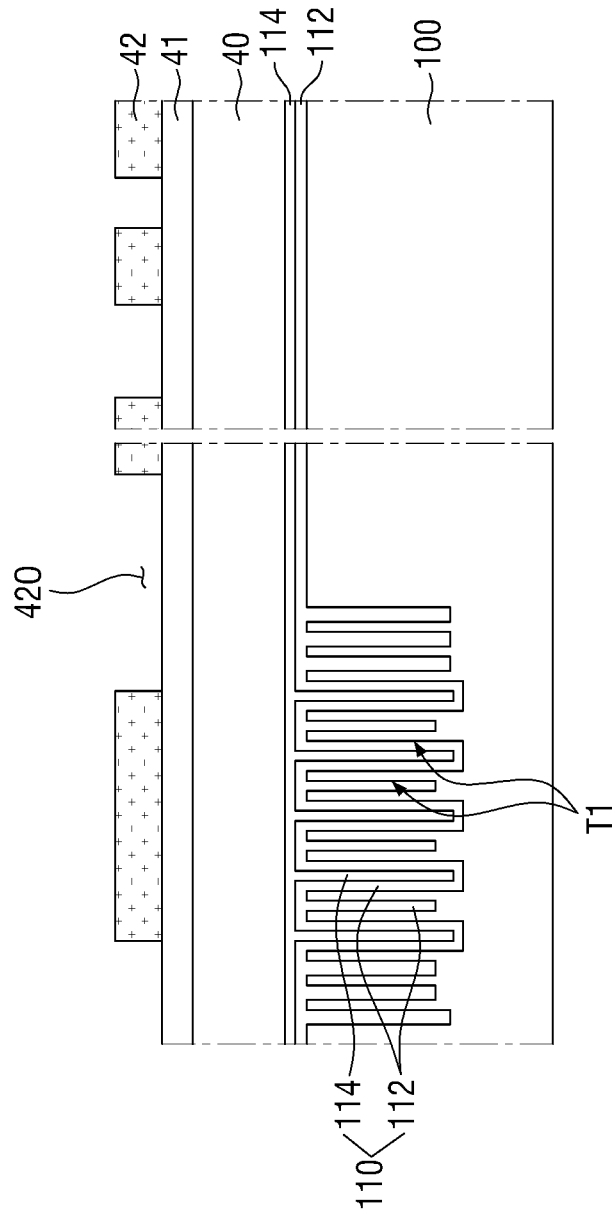

Referring to FIGS. 26 and 27, a fifth material layer 40, a fifth mask layer 41, and a third photoresist 42 are formed on the substrate 100.

The fifth material layer 40 may include, for example, a carbon-based material layer. For example, the fifth material layer 40 may include an ACL or an SOH material layer.

The fifth mask layer 41 may be formed on the fifth material layer 40. The fifth mask layer 41 may include a material having etch selectivity with respect to the fifth material layer 40. For example, when the fifth material layer 40 includes a carbon-based material layer, the fifth mask layer 41 may include a silicon oxide layer, a silicon nitride layer, or a silicon oxynitride layer.

The third photoresist 42 may be formed on the fifth mask layer 41. The third photoresist layer 42 may be a photoresist pattern formed by, for example, a photolithography process.

In some embodiments, the third photoresist 42 may expose a part of the peripheral region PERI and the boundary region INTERFACE. For example, the third photoresist 42 may include a second opening 420 exposing a part of the peripheral region PERI and the boundary region INTERFACE.

Figure 28:
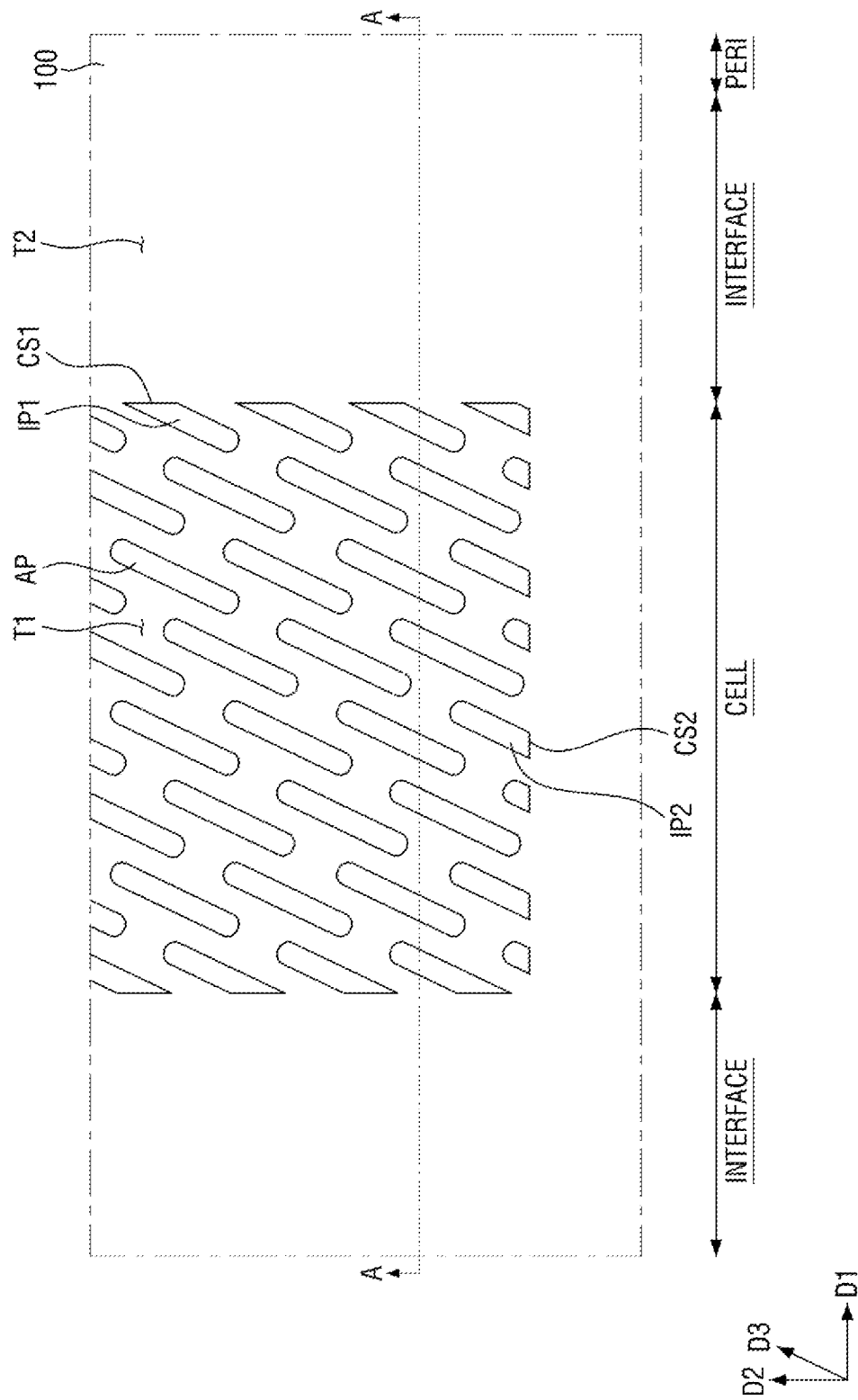
Figure 29:
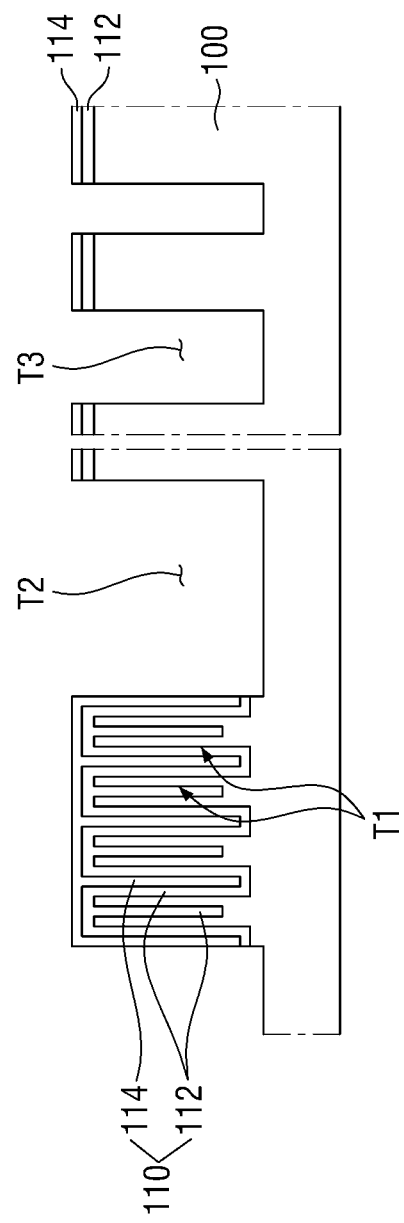

Referring to FIGS. 28 and 29, the substrate 100 is patterned using the third photoresist 42 as an etch mask.

For example, the fifth mask layer 41 may be patterned using the third photoresist 42 as an etch mask. Then, the fifth material layer 40 may be patterned using the patterned fifth mask layer 41 as an etch mask. Then, the dummy patterns DP and the first element isolation layer 110 may be patterned using the patterned fifth material layer 40 as an etch mask.

Accordingly, a second trench T2 may be formed in the substrate 100 of the boundary region INTERFACE to define the boundary region INTERFACE. Due to the second trench T2, the dummy patterns DP in the boundary region INTERFACE may form first boundary patterns IP1 including first boundary surfaces CS1 and second boundary patterns IP2 including second boundary surfaces CS2.

In addition, a third trench T3 may be formed in the substrate 100 of the peripheral region PERI to define active regions of the peripheral region PERI. For example, in some embodiments, the forming of the second trench T2 and the third trench T3 may be performed after the forming of the first trench T1.

Since the forming of the second trench T2 may include etching the dummy patterns DP (see FIG. 26), traces of the dummy patterns DP may remain in the second trench T2 in some embodiments. For example, due to a difference in etch rate between the dummy patterns DP and the first element isolation layer 110, a bottom surface of the second trench T2 may include a wavy first bottom surface T2a (see FIG. 7) and a flat second bottom surface T2b (see FIG. 7).

In some embodiments, the first bottom surface T2a (see FIG. 8) of the second trench T2 may be lower than the second bottom surface T2b (see FIG. 8) of the second trench T2. Alternatively, in some embodiments, the first bottom surface T2a (see FIG. 9) of the second trench T2 may be higher than the second bottom surface T2b (see FIG. 9) of the second trench T2. This may result from a difference in etch rate between the boundary region INTERFACE in which the dummy patterns DP are formed and the boundary region INTERFACE in which the dummy patterns DP are not formed in an etching process for forming the second trench T2, but embodiments are not limited to this case.

Figure 30:
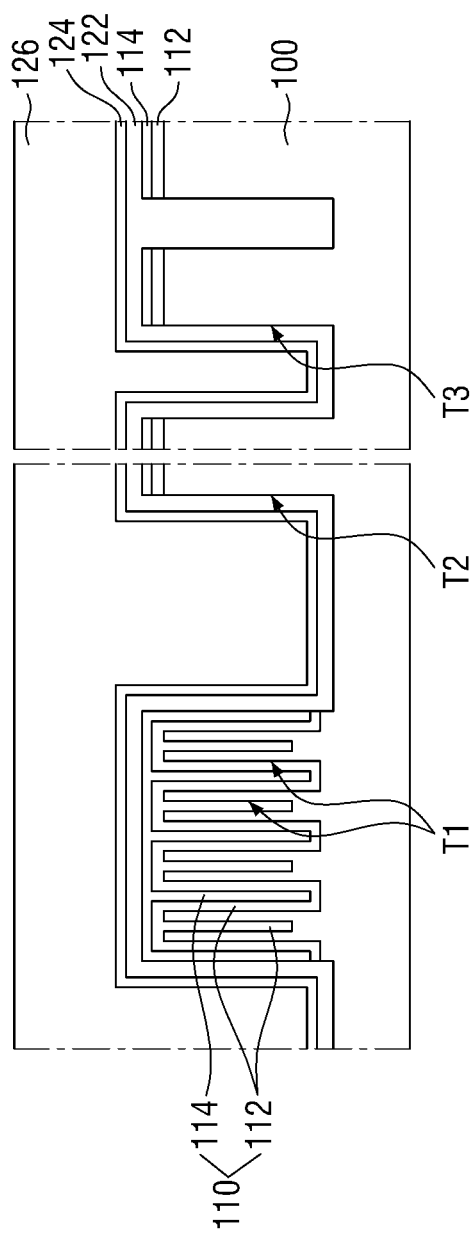

Referring to FIG. 30, a third insulating layer 122, a fourth insulating layer 124, and a fifth insulating layer 126 are sequentially formed in the second trench T2 and the third trench T3.

In some embodiments, the third insulating layer 122 may include silicon oxide, the fourth insulating layer 124 may include silicon nitride, and the fifth insulating layer 126 may include silicon oxide.

Next, referring to FIGS. 2 and 3, a second element isolation layer 120 is formed in the second trench T2, and a third element isolation layer 130 is formed in the third trench T3.

For example, a planarization process may be performed to expose upper surfaces of the active patterns AP. The planarization process may include, but is not limited to, a chemical mechanical polishing (CMP) process.

Accordingly, the second element isolation layer 120 may be formed in the substrate 100 of the boundary region INTERFACE to define the boundary region INTERFACE. In addition, the third element isolation layer 130 may be formed in the substrate 100 of the peripheral region PERI to define the active regions of the peripheral region PERI which constitute control elements and dummy elements.

FIGS. 31 through 39 are views illustrating steps of a method of fabricating a semiconductor device according to embodiments. For ease of description, redundant descriptions of elements and features identical to those described using FIGS. 1 through 30 will be given briefly or omitted.

Figure 31:
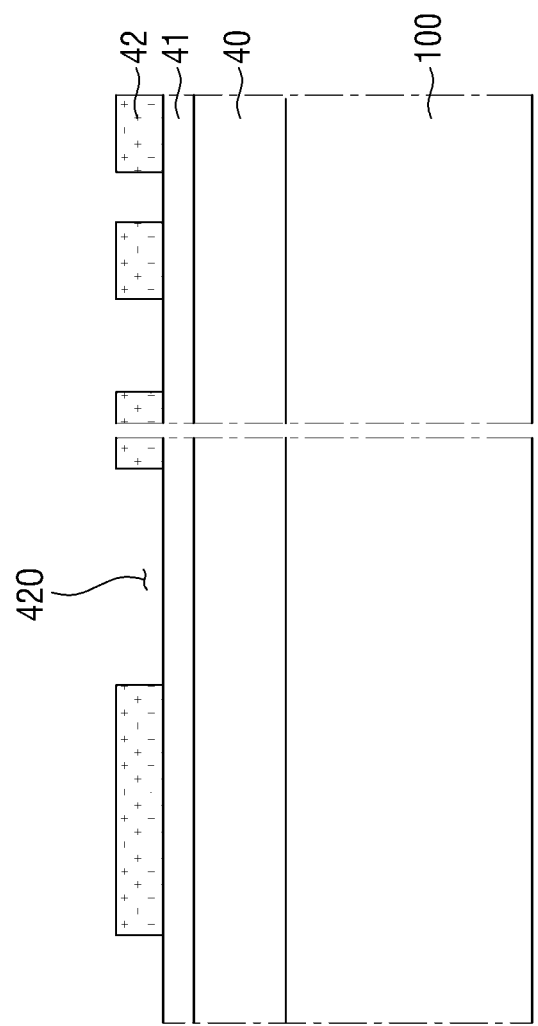
FIGS. 31 through 39 are views illustrating steps of a method of fabricating a semiconductor device according to embodiments.

Referring to FIG. 31, a fifth material layer 40, a fifth mask layer 41, and a third photoresist 42 are formed on a substrate 100.

The forming of the fifth material layer 40, the fifth mask layer 41, and the third photoresist 42 is similar to that described above using FIGS. 26 and 27, and thus a detailed description thereof will be omitted.

Figure 32:
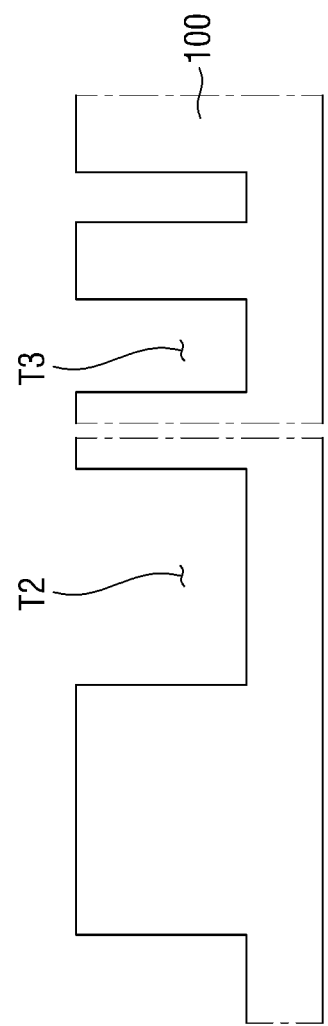

Referring to FIG. 32, the substrate 100 is patterned using the third photoresist 42 as an etch mask.

The patterning of the substrate 100 using the third photoresist 42 as an etch mask is similar to that described above using FIGS. 28 and 29, and thus a detailed description thereof will be omitted. Accordingly, a second trench T2 may be formed in the substrate 100 of a boundary region INTERFACE to define the boundary region INTERFACE. In addition, a third trench T3 may be formed in the substrate 100 of a peripheral region PERI to define active regions of the peripheral region PERI.

Figure 33:
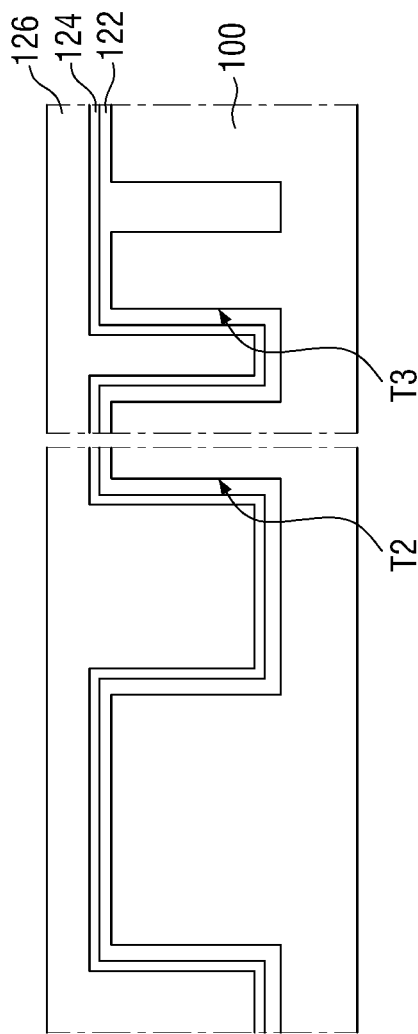

Referring to FIG. 33, a third insulating layer 122, a fourth insulating layer 124, and a fifth insulating layer 126 are sequentially formed in the second trench T2 and the third trench T3.

The forming of the third insulating layer 122, the fourth insulating layer 124, and the fifth insulating layer 126 is similar to that described above using FIG. 30, and thus a detailed description thereof will be omitted.

Figure 34:
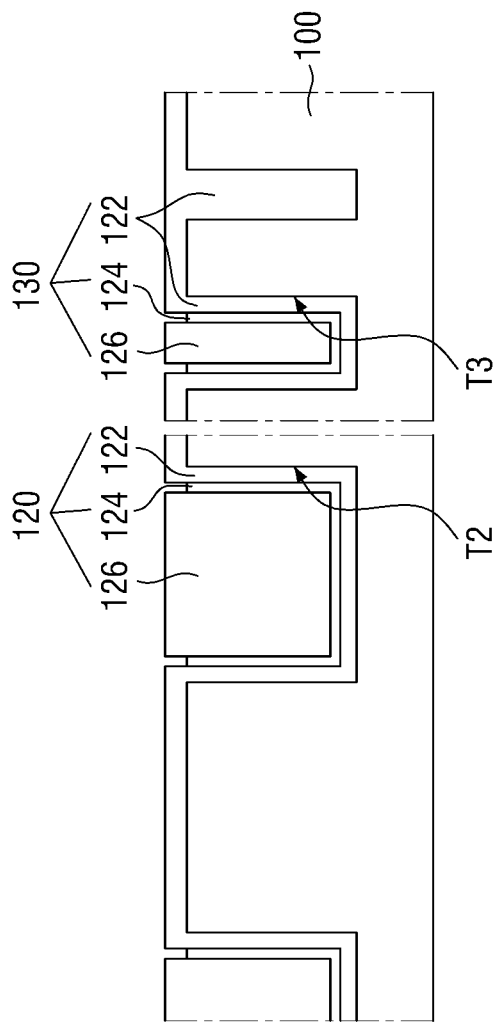

Referring to FIG. 34, a second element isolation layer 120 is formed in the second trench T2, and a third element isolation layer 130 is formed in the third trench T3.

For example, a planarization process may be performed to expose an upper surface of the third insulating layer 122. The planarization process may include, but is not limited to, a CMP process.

In some embodiments, an upper surface of the fourth insulating layer 124 may be recessed below upper surfaces of the third insulating layer 122 and the fifth insulating layer 126.

Figure 35:
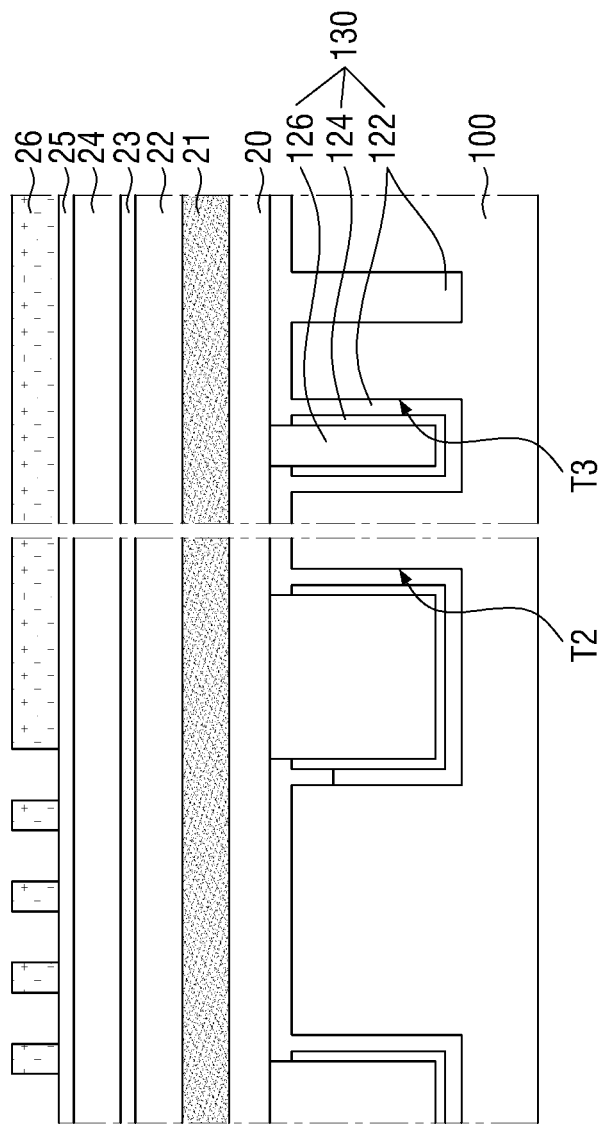

Referring to FIG. 35, a first material layer 20, a first mask layer 21, a second material layer 22, a second mask layer 23, a third material layer 24, a third mask layer 25, and a first photoresist 26 are sequentially formed on the substrate 100.

The forming of the first material layer 20, the first mask layer 21, the second material layer 22, the second mask layer 23, the third material layer 24, the third mask layer 25, and the first photoresist 26 is similar to that described above using FIG. 14, and thus a detailed description thereof will be omitted.

Figure 36:
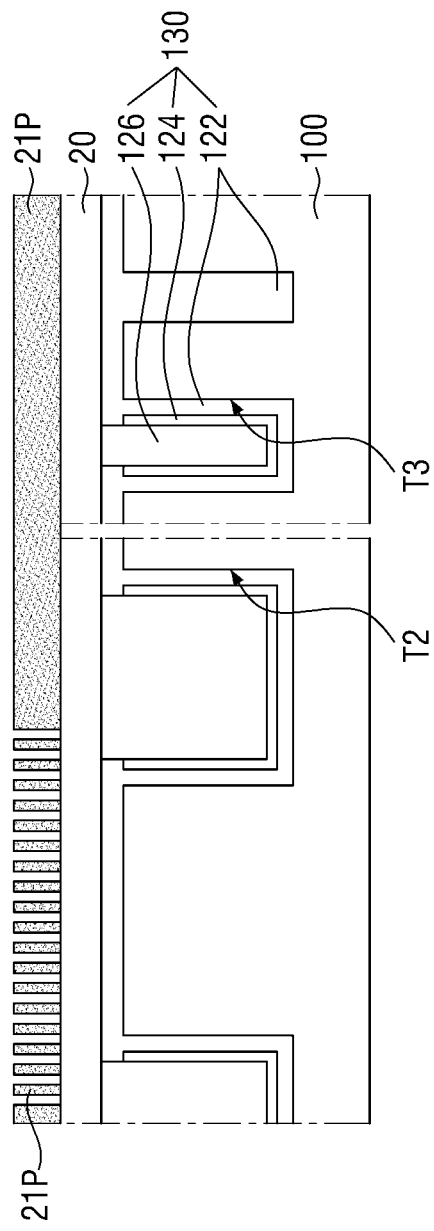

Referring to FIG. 36, the first mask layer 21 is patterned to form a third mask pattern 21P.

For example, the third mask pattern 21P may be formed using the QPT. The forming of the third mask pattern 21P is similar to that described above using FIGS. 15 through 18, and thus a detailed description thereof will be omitted.

In some embodiments, the third mask pattern 21P may expose at least a part of the boundary region INTERFACE. For example, at least a part of the third mask pattern 21P may extend to the boundary region INTERFACE adjacent to a cell region CELL. Accordingly, at least a part of the third mask pattern 21P may overlap a part of the second element isolation layer 120.

Figure 37:
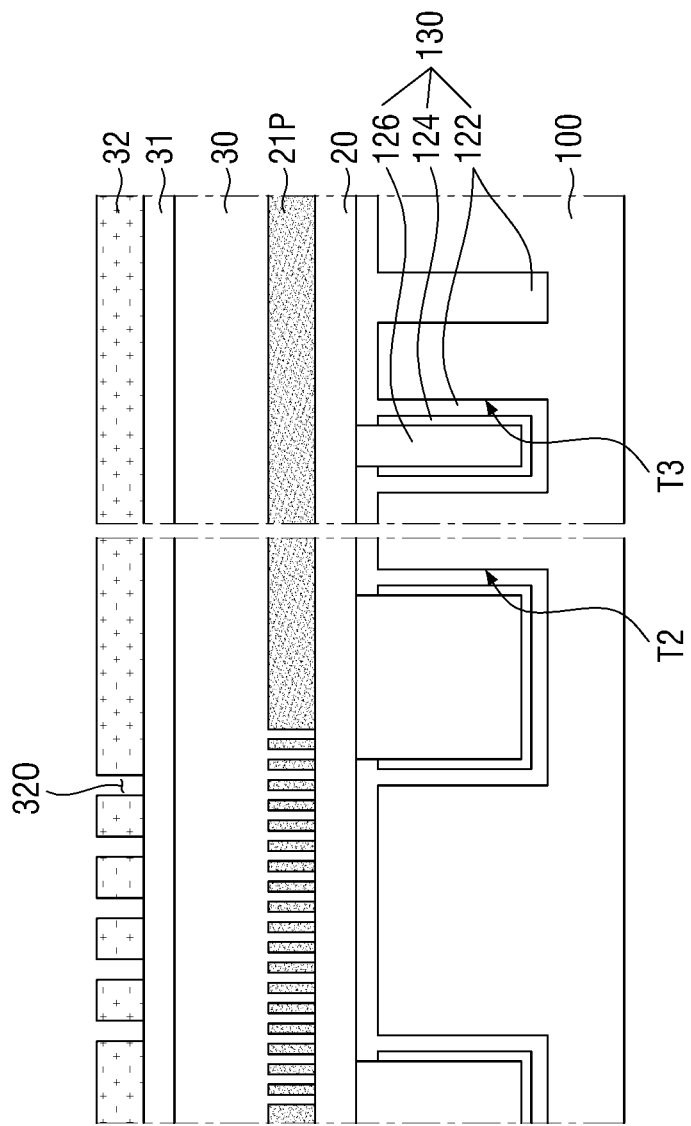

Referring to FIG. 37, a fourth material layer 30, a fourth mask layer 31, and a second photoresist 32 are sequentially formed on the third mask pattern 21P.

The forming of the fourth material layer 30, the fourth mask layer 31, and the second photoresist 32 on the third mask pattern 21P is similar to that described above using FIGS. 19 and 20, and thus a detailed description thereof will be omitted.

Figure 38:
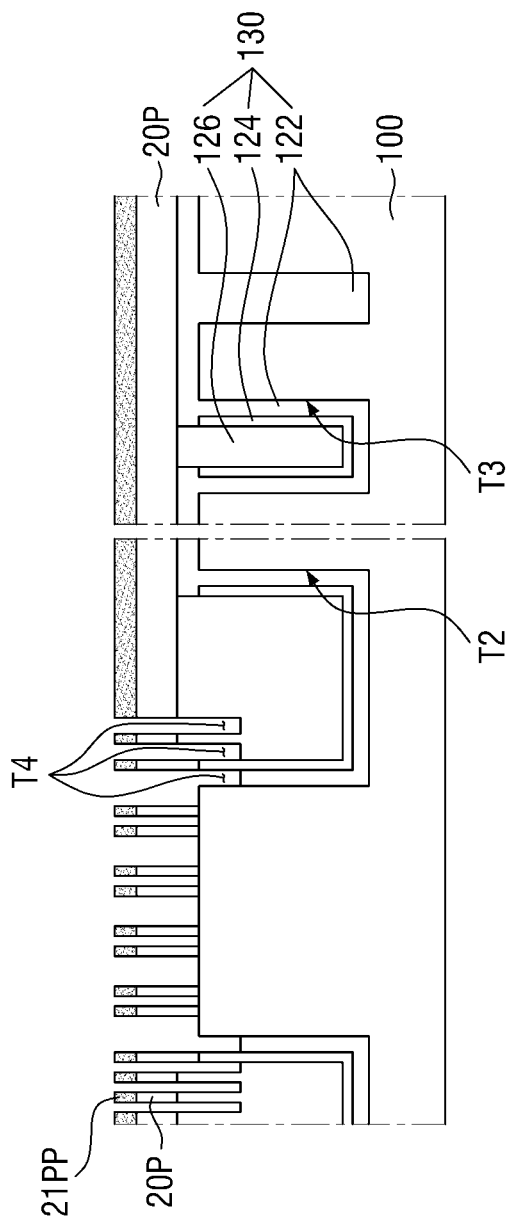

Referring to FIG. 38, the third mask pattern 21P is patterned to form fourth mask patterns 21PP.

The forming of the fourth mask patterns 21PP is similar to that described above using FIGS. 21 and 22, and thus a detailed description thereof will be omitted.

Next, the first material layer 20 is patterned using the fourth mask patterns 21PP as an etch mask, thereby forming third material patterns 20P.

In some embodiments, a part of the second element isolation layer 120 may be patterned at the same time as the forming of the third material patterns 20P. For example, at least some of the fourth mask patterns 21PP may overlap parts of the second element isolation layer 120. Accordingly, the second element isolation layer 120 may be partially etched while the first material layer 20 is patterned. Accordingly, fourth trenches T4 may be formed in an upper part of the second element isolation layer 120 adjacent to the cell region CELL.

Figure 39:
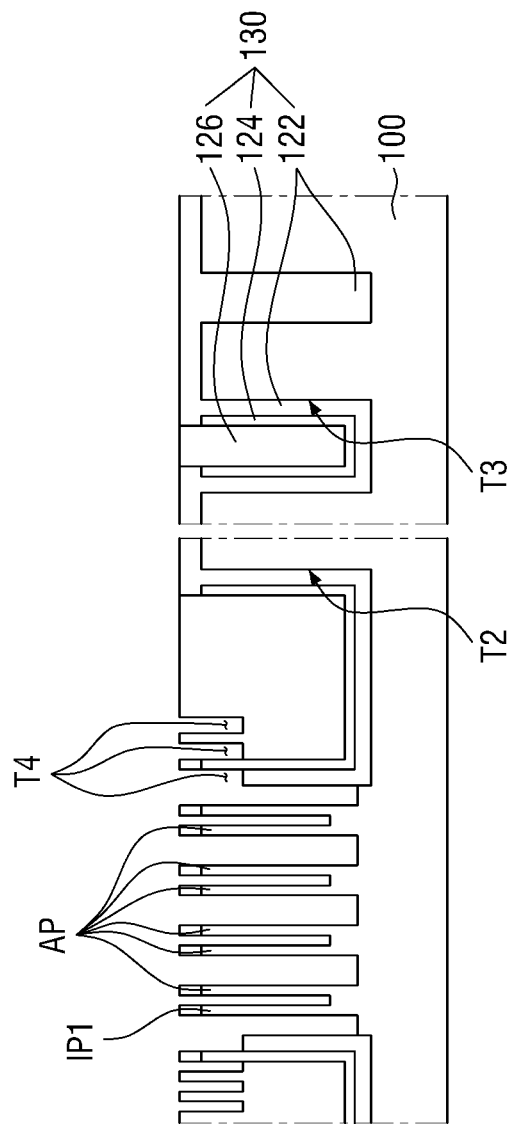

Referring to FIG. 39, the substrate 100 is patterned using the third material patterns 20P as an etch mask.

For example, an etching process using the third material patterns 20P as an etch mask may be performed to form a first trench T1 in the substrate 100. Accordingly, a plurality of active patterns AP defined by the first trench T1 may be formed in the cell region CELL. For example, in some embodiments, the forming of a second trench T2 and a third trench T3 may be performed before the forming of the first trench T1.

Next, referring to FIG. 10, the first element isolation layer 110 is formed in the first trench T1, and a sixth insulating layer 128 is formed in the fourth trenches T4.

For example, a first insulating layer 112 and a second insulating layer 114 may be sequentially formed on the substrate 100 to fill the first trench T1 and the fourth trenches T4. Accordingly, the first element isolation layer 110 may be formed in the substrate 100 to define the active patterns AP. In addition, the sixth insulating layer 128 may be formed to fill the fourth trenches T4.

While the present inventive concept has been shown and described with reference to exemplary embodiments thereof, it will be apparent to those of ordinary skill in the art that various changes in form and detail may be made therein without departing from the spirit and scope of the invention as defined by the following claims.

What is claimed is:

1. A semiconductor device comprising:
   a substrate which comprises a cell region, a boundary region, and a peripheral region sequentially arranged in a first direction;
   an active pattern which extends in the cell region in a second direction forming a first acute angle with respect to the first direction;
   a boundary pattern which is formed in the cell region and is directly adjacent to the boundary region,
   wherein the boundary pattern comprises a first side surface extending in the second direction and a first boundary surface extending in a third direction, which is perpendicular to the first direction, from the first side surface, and
   wherein the first boundary surface defines a boundary between the cell region and the boundary region;
   a first element isolation layer which is formed in the cell region to define the first side surface of the boundary pattern and side surfaces of the active pattern; and
   a second element isolation layer which is formed in the boundary region to define the first boundary surface of the boundary pattern.

2. The semiconductor device of claim 1, further comprising:
   a third element isolation layer in the peripheral region,
   wherein the second element isolation layer and the third element isolation layer are formed at a same vertical level.

3. The semiconductor device of claim 1,
   wherein the first side surface and the first boundary surface meet to form a first internal angle, and
   wherein the sum of the first acute angle and the first internal angle is 90 degrees.

4. The semiconductor device of claim 1,
   wherein the boundary pattern further comprises a second side surface which is opposite the first side surface and extends in the second direction.

5. The semiconductor device of claim 4,
   wherein the first side surface and the first boundary surface meet to form a first internal angle,
   wherein the second side surface and the first boundary surface meet to form a second internal angle, and
   wherein the sum of the first internal angle and the second internal angle is 180 degrees.

6. The semiconductor device of claim 1,
   wherein a first width of the active pattern is greater than a second width of the boundary pattern in a cut plane intersecting the first boundary surface and extending in the first direction.

7. The semiconductor device of claim 1,
   wherein a top surface of each of the active patterns is higher than a top surface of the boundary pattern.

8. The semiconductor device of claim 1,
   wherein a bottom surface of the first element isolation layer is higher than a bottom surface of the second element isolation layer.

9. A semiconductor device comprising:
   a substrate which comprises a cell region, a peripheral region around the cell region, and a boundary region between the cell region and the peripheral region;
   a plurality of active patterns in the cell region;
   a first boundary pattern which is formed in the cell region and comprises a first boundary surface defining a first portion of a boundary between the cell region and the boundary region; and
   a gate electrode which extends in a first direction and crosses the plurality of active patterns and the first boundary pattern,
   wherein a first width of each of the active patterns is greater than a second width of the first boundary pattern in a cut plane intersecting the first boundary surface and extending in the first direction, and
   wherein a top surface of each of the active patterns is higher than a top surface of the first boundary pattern.

10. The semiconductor device of claim 9,
    wherein a first depth of the gate electrode overlapping each of the plurality of active patterns is smaller than a second depth of the gate electrode overlapping the first boundary pattern.

11. The semiconductor device of claim 9,
    wherein each of the plurality of active patterns comprises a first side surface which extends in a second direction forming an acute angle with respect to the first direction and a second side surface which is opposite the first side surface and extends in the second direction, and
    the first boundary pattern comprises a third side surface which extends in the second direction from the first boundary surface.

12. The semiconductor device of claim 11,
    wherein the first width is a distance between the first side surface and the second side surface in the first direction, and
    the second width is a distance between the third side surface and the first boundary surface in the first direction.

13. The semiconductor device of claim 9, further comprising:
    a second boundary pattern which is formed in the cell region and spaced apart from the first boundary pattern in the first direction,
    wherein the second boundary pattern comprises a second boundary surface defining a second portion of the boundary between the cell region and the boundary region.

14. The semiconductor device of claim 13,
    wherein the plurality of active patterns are disposed between the first boundary pattern and the second boundary pattern in a second direction in which each of the plurality of active patterns extends, and
    wherein an area of each of the plurality of active patterns is bigger than an area of the first boundary pattern.

15. The semiconductor device of claim 13,
    wherein the first boundary surface and the second boundary surface lie in the same plane.

16. The semiconductor device of claim 13,
    wherein the first boundary surface extends in a second direction perpendicular to the first direction, and
    the second boundary surface extends in the first direction.

17. A semiconductor device comprising:
    a substrate which comprises a cell region, a peripheral region around the cell region, and a boundary region between the cell region and the peripheral region;
    a plurality of active patterns in the cell region;

a first boundary pattern which is formed in the cell region and is directly adjacent to the boundary region;

a gate electrode which extends in a first direction and crosses the plurality of active patterns and the first boundary pattern;

a bit line which extends in a second direction intersecting the first direction and is connected to a first source/drain region of each of the plurality of active patterns; and a capacitor structure which is formed on the cell region and is connected to a second source/drain region of each of the plurality of active patterns, wherein the first boundary pattern comprises a first side surface which extends in a third direction forming an acute angle with the first direction and a first boundary surface which defines a first portion of a boundary between the cell region and the boundary region, and wherein the substrate comprises:
a first trench which is formed in the cell region and defines the first side surface of the first boundary pattern and side surfaces of each of the active patterns;
a second trench which is formed in the boundary region and defines the first boundary surface of the first boundary pattern; and
a third trench which is formed in the peripheral region and is spaced apart from the second trench.

18. The semiconductor device of claim 17, further comprising:
a first element isolation layer which fills the first trench;
a second element isolation layer which fills the second trench; and
a third element isolation layer which fills the third trench.

19. The semiconductor device of claim 17,
wherein the first boundary surface extends in the second direction.

* * * * *